(12) United States Patent
Ha et al.

(10) Patent No.: US 11,843,017 B2
(45) Date of Patent: Dec. 12, 2023

(54) IMAGE SENSOR

(71) Applicant: SAMSUNG ELECTRONICS CO., LTD., Suwon-si (KR)

(72) Inventors: Hyoun-Jee Ha, Hwaseong-si (KR); Changhwa Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 255 days.

(21) Appl. No.: 17/172,250

(22) Filed: Feb. 10, 2021

(65) Prior Publication Data

US 2021/0375973 A1 Dec. 2, 2021

(30) Foreign Application Priority Data

May 29, 2020 (KR) .......................... 10-2020-0065066

(51) Int. Cl.
*H01L 27/146* (2006.01)
*H01L 27/148* (2006.01)

(52) U.S. Cl.
CPC .... *H01L 27/14636* (2013.01); *H01L 27/1463* (2013.01); *H01L 27/14612* (2013.01); *H01L 27/14621* (2013.01); *H01L 27/14627* (2013.01); *H01L 27/14643* (2013.01); *H01L 27/14831* (2013.01)

(58) Field of Classification Search
CPC ......... H01L 27/14636; H01L 27/14612; H01L 27/14621; H01L 27/14627; H01L 27/1463; H01L 27/14643; H01L 27/14831
See application file for complete search history.

(56) References Cited

U.S. PATENT DOCUMENTS

| | | | |
|---|---|---|---|
| 9,337,099 B1 | 5/2016 | Jain et al. | |
| 9,412,693 B2 | 8/2016 | Kim et al. | |
| 9,673,248 B2 | 6/2017 | Kuo et al. | |
| 10,153,313 B2 | 12/2018 | Park et al. | |
| 2013/0323875 A1* | 12/2013 | Park | H01L 31/022408 438/70 |
| 2016/0027828 A1 | 1/2016 | Lee et al. | |

(Continued)

FOREIGN PATENT DOCUMENTS

KR 10-0870822 11/2008

*Primary Examiner* — Jay C Kim
*Assistant Examiner* — Woo K Lee
(74) *Attorney, Agent, or Firm* — F. Chau & Associates, LLC

(57) ABSTRACT

An image sensor includes a substrate having a first surface and a second surface that are opposite to each other. The substrate including a plurality of unit pixel regions having photoelectric conversion regions and floating diffusion regions disposed adjacent to the first surface. A pixel isolation pattern is disposed in the substrate and is configured to define the plurality of unit pixel regions. An interconnection layer is disposed on the first surface of the substrate. The interconnection layer includes a conductive structure having a connection portion that extends parallel to the first surface of the substrate and is spaced apart from the first surface of the substrate. Contacts extend vertically from the connection portion towards the first surface of the substrate. Each of the contacts are spaced apart from each other with the pixel isolation pattern interposed therebetween. The contacts are coupled to the floating diffusion regions, respectively.

17 Claims, 22 Drawing Sheets

(56) References Cited

U.S. PATENT DOCUMENTS

| | | |
|---|---|---|
| 2019/0067353 A1 | 2/2019 | Tsao et al. |
| 2020/0144316 A1* | 5/2020 | Kim .................... H01L 27/1464 |
| 2021/0028205 A1* | 1/2021 | Yanagita ........... H01L 27/14636 |

* cited by examiner

IMAGE SENSOR

CROSS-REFERENCE TO RELATED APPLICATIONS

This application claims priority under 35 U.S.C. § 119 to Korean Patent Application No. 10-2020-0065066, filed on May 29, 2020 in the Korean Intellectual Property Office, the disclosure of which is incorporated by reference in its entirety herein.

1. TECHNICAL FIELD

The present inventive concepts relate to an image sensor, and in particular, to a conductive structure of an image sensor.

2. DISCUSSION OF RELATED ART

An image sensor is a device that converts an optical image into electrical signals. The image sensor may be classified into two types: a charge coupled device (CCD) type and a complementary metal-oxide-semiconductor (CMOS) type (a "CIS" type). The CIS includes a plurality of unit pixel regions which are two-dimensionally arranged. Each of the unit pixel regions includes a photodiode which is used to convert an incident light to an electric signal.

SUMMARY

An exemplary embodiment of the present inventive concepts provides an image sensor with improved resolution.

According to an exemplary embodiment of the inventive concept, an image sensor includes a substrate having a first surface and a second surface that are opposite to each other. The substrate including a plurality of unit pixel regions having photoelectric conversion regions and floating diffusion regions disposed adjacent to the first surface. A pixel isolation pattern is disposed in the substrate and is configured to define the plurality of unit pixel regions. An interconnection layer is disposed on the first surface of the substrate. The interconnection layer includes a conductive structure having a connection portion that extends parallel to the first surface of the substrate and is spaced apart from the first surface of the substrate. Contacts extend vertically from the connection portion towards the first surface of the substrate. Each of the contacts are spaced apart from each other with the pixel isolation pattern interposed therebetween. The contacts are coupled to the floating diffusion regions, respectively.

According to an exemplary embodiment of the present inventive concepts, an image sensor includes a substrate having a first surface and a second surface that are opposite to each other. The substrate includes a plurality of pixel groups. Each of the plurality of pixel groups includes first to fourth unit pixel regions. The first to fourth unit pixel regions include first to fourth floating diffusion regions, respectively. A pixel isolation pattern penetrates the substrate and is configured to define the first to fourth unit pixel regions. Color filters and micro lenses are disposed on the second surface of the substrate. An interconnection layer is disposed on the first surface of the substrate. The interconnection layer includes a conductive structure. The conductive structure includes a connection portion that extends parallel to the first surface of the substrate and is spaced apart from the first surface of the substrate. First to fourth contacts extend vertically from the connection portion and are coupled to the first to fourth floating diffusion regions, respectively. The connection portion is configured to electrically connect the first to fourth contacts to each other.

According to an exemplary embodiment of the present inventive concepts, an image sensor includes a substrate having a first surface and a second surface that are opposite to each other. The substrate includes a pixel array region, an optical black region, and a pad region. The pixel array region includes a plurality of unit pixel regions having photoelectric conversion regions. A pixel isolation pattern and a device isolation pattern are disposed in the substrate. The pixel isolation pattern penetrates the device isolation pattern and is configured to define the plurality of unit pixel regions. An interconnection layer is disposed on the first surface of the substrate. Transfer transistors and logic transistors are disposed on the first surface of the substrate. Color filters and micro lenses are disposed on the second surface of the substrate. A first light-blocking pattern and a first pad terminal are disposed in the optical black region of the substrate. The first light-blocking pattern penetrates the substrate. The first pad terminal is disposed on the second surface of the substrate and is configured to be electrically connected to the first light-blocking pattern. A second pad terminal is disposed in the pad region of the substrate and is disposed on the second surface of the substrate. The interconnection layer includes a first insulating layer arranged to cover the first surface of the substrate. A conductive structure penetrates the first insulating layer. The conductive structure includes a connection portion that extends parallel to the first surface of the substrate, and contacts that extend vertically from the connection portion towards the first surface of the substrate. Interconnection lines and vias are disposed on and coupled to the conductive structure.

BRIEF DESCRIPTION OF THE DRAWINGS

Exemplary embodiments of the present inventive concepts will be more clearly understood from the following brief description taken in conjunction with the accompanying drawings. The accompanying drawings represent non-limiting, exemplary embodiments as described herein.

It should be noted that these figures are intended to illustrate the general characteristics of methods, structure and/or materials utilized in certain exemplary embodiments and to supplement the written description provided below. These drawings are not, however, to scale and may not precisely reflect the precise structural or performance characteristics of any given embodiment, and should not be interpreted as defining or limiting the range of values or properties encompassed by exemplary embodiments of the present inventive concepts. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXEMPLARY EMBODIMENTS

Exemplary embodiments of the present inventive concepts will now be described more fully with reference to the accompanying drawings, in which example embodiments are shown.

Figure 1:
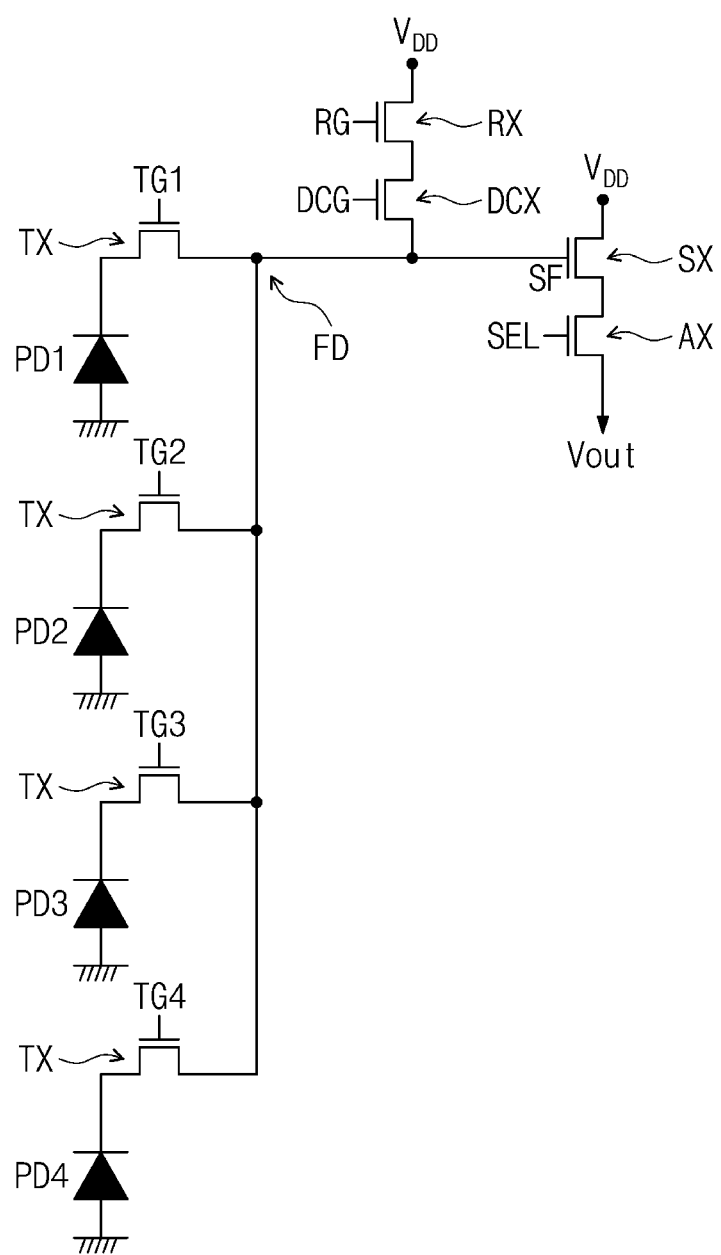
FIG. 1 is a circuit diagram illustrating an image sensor according to an exemplary embodiment of the present inventive concepts.

FIG. 1 is a circuit diagram illustrating an image sensor according to an exemplary embodiment of the present inventive concepts.

Referring to FIG. 1, an image sensor may include a plurality of unit pixel regions, which include a plurality of photoelectric conversion regions, such as first to fourth photoelectric conversion regions PD1, PD2, PD3, and PD4, transfer transistors TX, a source follower transistor SX, a reset transistor RX, a dual conversion transistor DCX, and a selection transistor AX. The transfer transistor TX, the source follower transistor SX, the reset transistor RX, the dual conversion transistor DCX, and the selection transistor AX may include a transfer gate TG, a source follower gate SF, a reset gate RG, a dual conversion gate DCG, and a selection gate SEL, respectively.

Each of the first to fourth photoelectric conversion regions PD1, PD2, PD3, and PD4 may be a photodiode including an n-type impurity region and a p-type impurity region. A floating diffusion region FD may serve as a common drain of the transfer transistors TX. The floating diffusion region FD may serve as a source of the dual conversion transistor DCX. The floating diffusion region FD may be electrically connected to the source follower gate SF of the source follower transistor SX. The source follower transistor SX may be connected to the selection transistor AX.

Hereinafter, an operation of the image sensor will be described with reference to the exemplary embodiment of FIG. 1. First, a power voltage $V_{DD}$ may be applied to a drain of the reset transistor RX and a drain of the source follower transistor SX in a light-blocking state, and then the reset transistor RX and the dual conversion transistor DCX may be turned on to discharge electric charges from the floating diffusion region FD. Thereafter, electron-hole pairs may be produced in the plurality of photoelectric conversion regions, such as the first to fourth photoelectric conversion regions PD1, PD2, PD3, and PD4, by turning the reset transistor RX off and entering an external light into the first to fourth photoelectric conversion regions PD1, PD2, PD3, and PD4. Holes may be moved to and accumulated in the n-type impurity regions of the first to fourth photoelectric conversion regions PD1, PD2, PD3, and PD4, whereas electrons may be moved to and accumulated in the n-type impurity region. If the transfer transistors TX are turned on, the electric charges, such as the electrons and holes, may be transferred to and accumulated in the floating diffusion region FD. A change in the accumulated charge amount may lead to a change in gate bias of the source follower transistor SX and consequently a change in source potential of the source follower transistor SX. In this exemplary embodiment, if the selection transistor AX is turned on, an amount of the electric charges may be read out as a signal to be transmitted through a column.

An interconnection line may be electrically connected to at least one of the transfer gate TG, the source follower gate SF, the dual conversion gate DCG, the reset gate RG and the selection gate SEL. The interconnection line may be configured to apply the power voltage $V_{DD}$ to the drain of the reset transistor RX or the drain of the source follower transistor SX. The interconnection line may include a column line connected to the selection transistor AX. The interconnection line may be a plurality of interconnection lines, which will be described below.

FIG. 1 illustrates an example, in which a single floating diffusion region FD is electrically shared by the first to fourth photoelectric conversion regions PD1, PD2, PD3, and PD4. However, exemplary embodiments of the present inventive concepts are not limited to thereto. For example, one unit pixel region may be configured to include one of the first to fourth photoelectric conversion regions PD1, PD2, PD3, and PD4, the floating diffusion region FD, and four transistors, such as the transfer transistor TX, the reset transistor RX, the selection transistor AX, and the source follower transistor SX. The reset, source follower, or selection transistor RX, SX, or AX may be shared by neighboring unit pixel regions. In this exemplary embodiment, an integration density of the image sensor may be increased.

Figure 2:
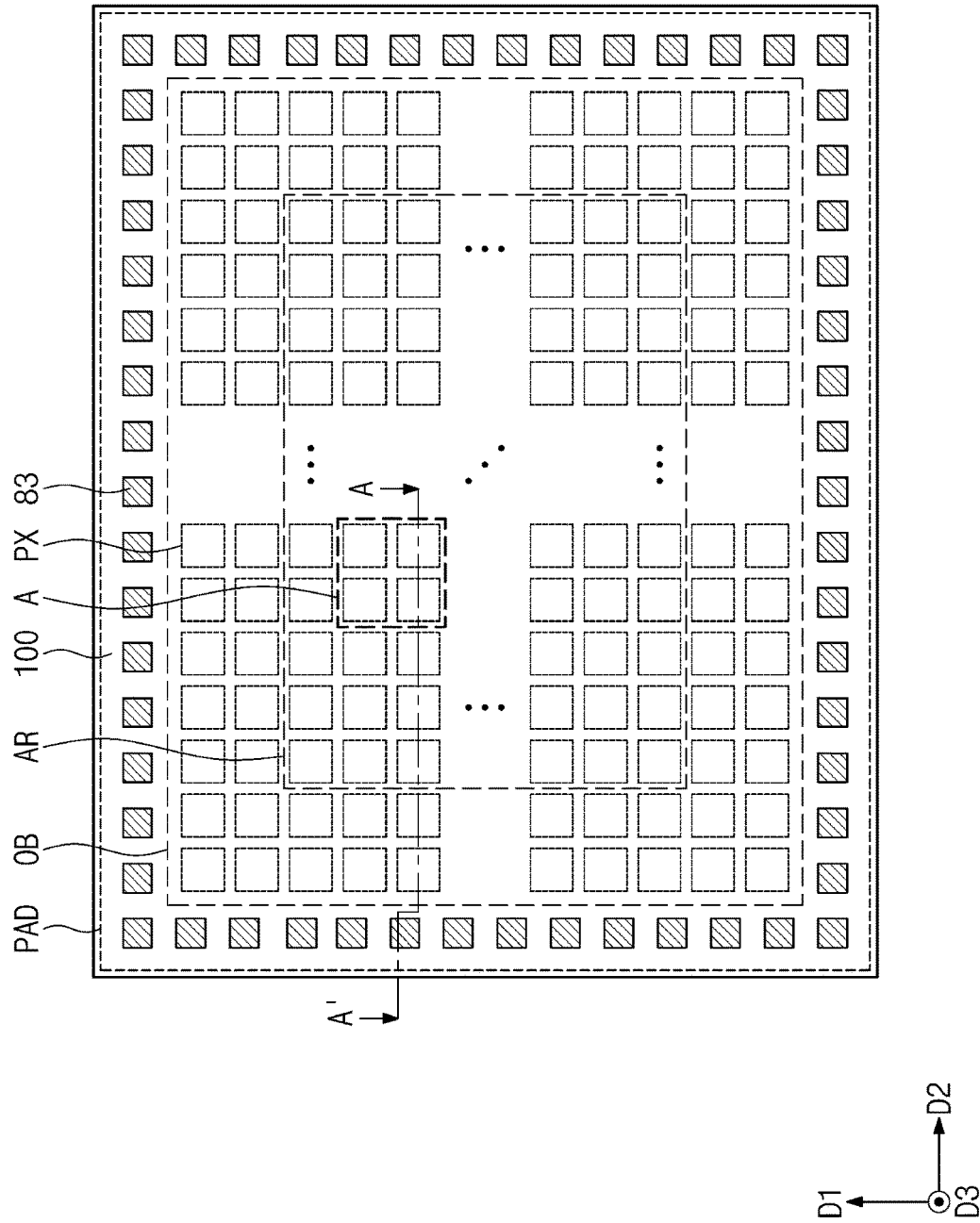
FIG. 2 is a plan view illustrating an image sensor according to an exemplary embodiment of the present inventive concepts.
Figure 3:
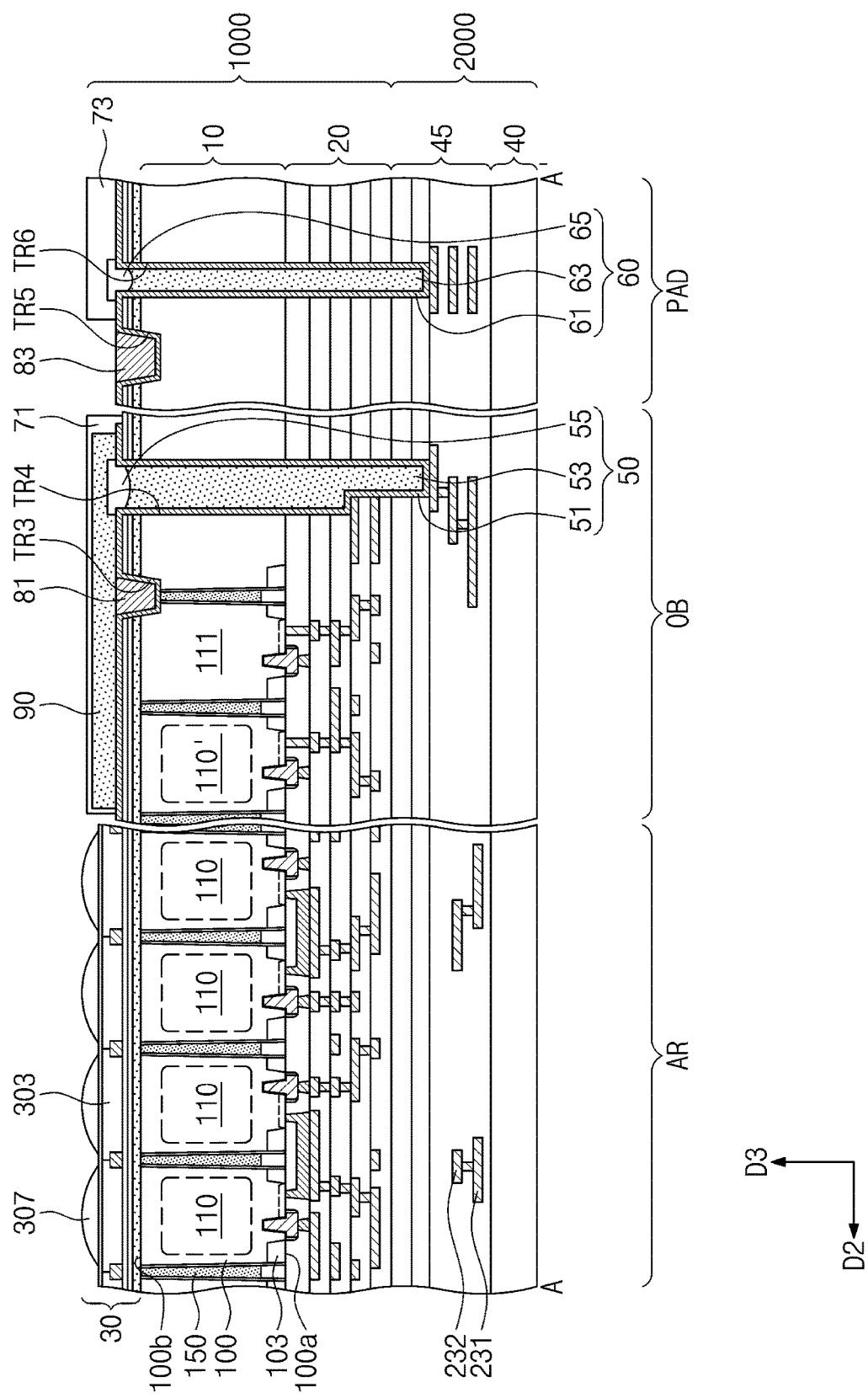
FIG. 3 is a cross-sectional view taken along a line A-A' of FIG. 2 according to an exemplary embodiment of the present inventive concepts.

FIG. 2 is a plan view illustrating an image sensor according to an exemplary embodiment of the present inventive concepts. FIG. 3 is a cross-sectional view taken along a line A-A' of FIG. 2.

Referring to FIGS. 2 and 3, an image sensor may include a sensor chip 1000 and a circuit chip 2000, such as a logic chip. The sensor chip 1000 may include a photoelectric conversion layer 10, a first interconnection layer 20, and an optically-transparent layer 30. The photoelectric conversion layer 10 may include a first substrate 100, a pixel isolation pattern 150, a device isolation pattern 103, and photoelectric conversion regions 110 disposed in the first substrate 100. The photoelectric conversion regions 110 may convert light, which is incident from the outside, to electrical signals.

As shown in the exemplary embodiment of FIG. 2, the first substrate 100 may include a pixel array region AR, an optical black region OB, and a pad region PAD, when viewed in a plan view (e.g., in a plane defined in the first and second directions D1, D2). In an exemplary embodiment, the pixel array region AR may be disposed in a center region of the first substrate 100, when viewed in a plan view (e.g., in a plane defined in the first and second directions D1, D2). The pixel array region AR may include a plurality of unit pixel regions PX. The unit pixel regions PX may generate and output a photoelectric signal from the incident light. As shown in the exemplary embodiment of FIG. 2, the unit pixel regions PX may be two-dimensionally arranged to form a plurality of columns and a plurality of rows. The columns may extend in the first direction D1 and may be arranged in the second direction D2. The rows may extend in the second direction D2 and may be arranged in the first direction D1. In the present specification, the first direction D1 and the second direction D2 may be parallel to a first surface 100a of the first substrate 100. The second direction D2 may cross the first direction D1. For example, in an exemplary embodiment, the second direction D2 may be substantially perpendicular to the first direction D1. However, exemplary embodiments of the present inventive concepts are not limited thereto. A third direction D3 may be substantially perpendicular to the first surface 100a of the first substrate 100 and may be a thickness direction of the first substrate 100.

The pad region PAD may be disposed in an edge region of the first substrate 100 to enclose the pixel array region AR, when viewed in a plan view (e.g., in a plane defined in the first and second directions D1, D2). Second pad terminals 83 may be disposed on the pad region PAD. The second pad terminals 83 may be used to output electrical signals, which are produced in the unit pixel regions PX, to the outside. In addition, an external signal or voltage may be provided to the unit pixel regions PX through the second pad terminals 83. Since the pad region PAD is provided in the edge region of the first substrate 100, the second pad terminals 83 may be easily coupled to the outside.

The optical black region OB may be disposed between the pixel array region AR and the pad region PAD of the first substrate 100. The optical black region OB may enclose the pixel array region AR, when viewed in a plan view (e.g., in a plane defined in the first and second directions D1, D2). The optical black region OB may include a plurality of dummy regions 111. A signal produced in the dummy region 111 may be used as information for removing a process noise. Hereinafter, the pixel array region AR of the image sensor will be described in more detail with reference to FIGS. 4 to 14.

Figure 4:
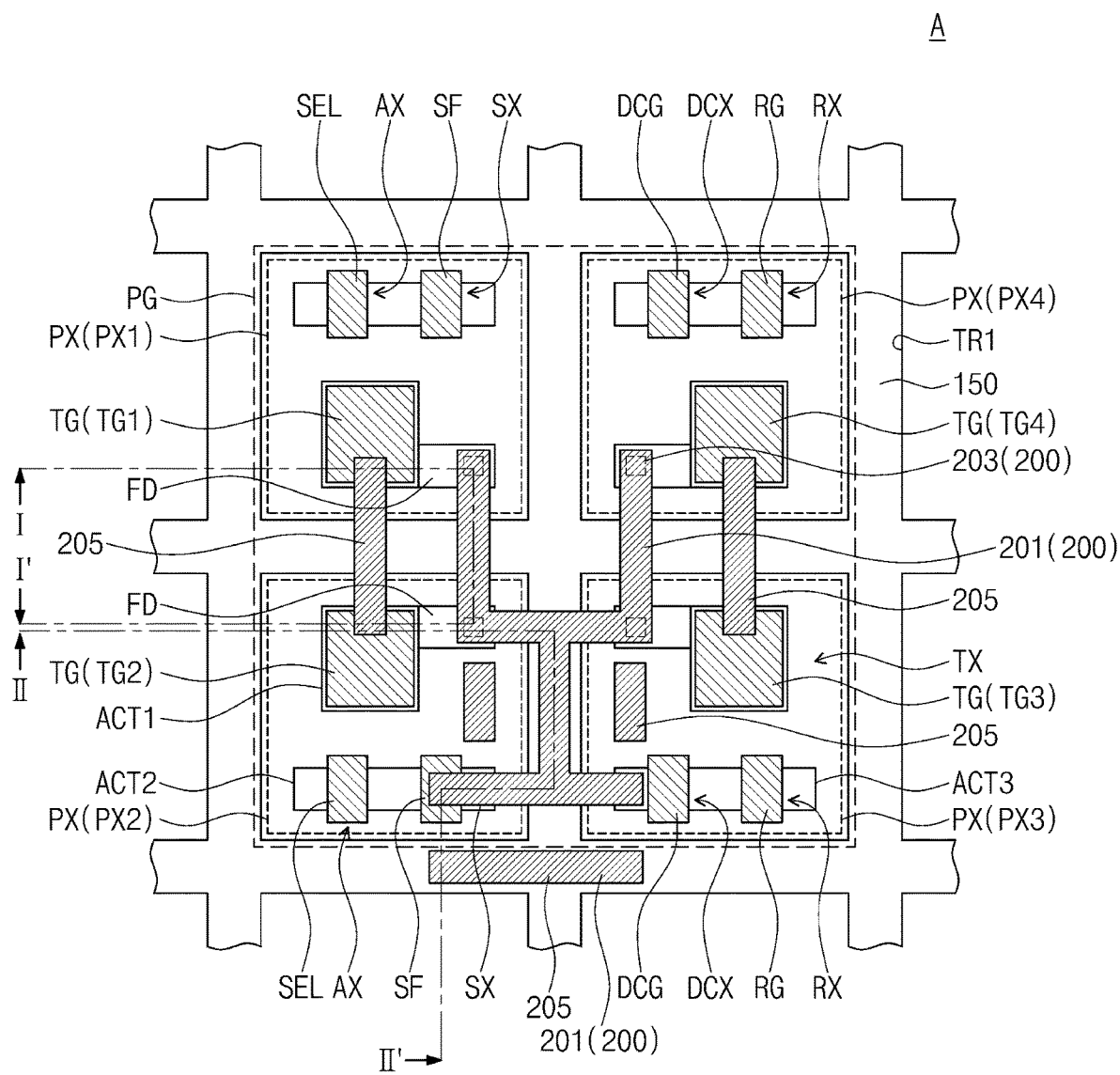
FIG. 4 is an enlarged plan view illustrating a region A of FIG. 2 according to an exemplary embodiment of the present inventive concepts.
Figure 5:
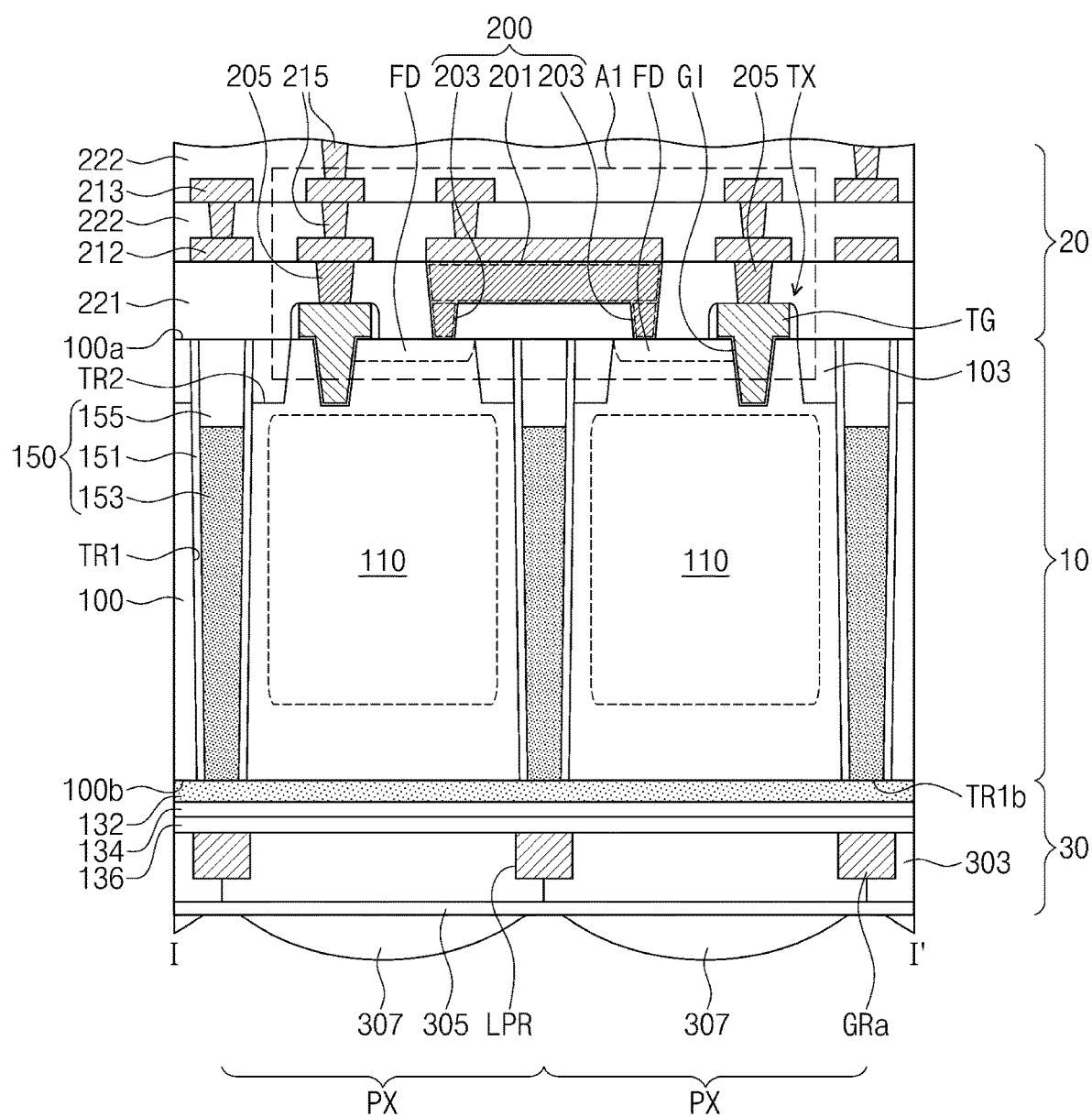
FIG. 5 is a cross-sectional view taken along a line I-I' of FIG. 4 according to an exemplary embodiment of the present inventive concepts.
Figure 8A:
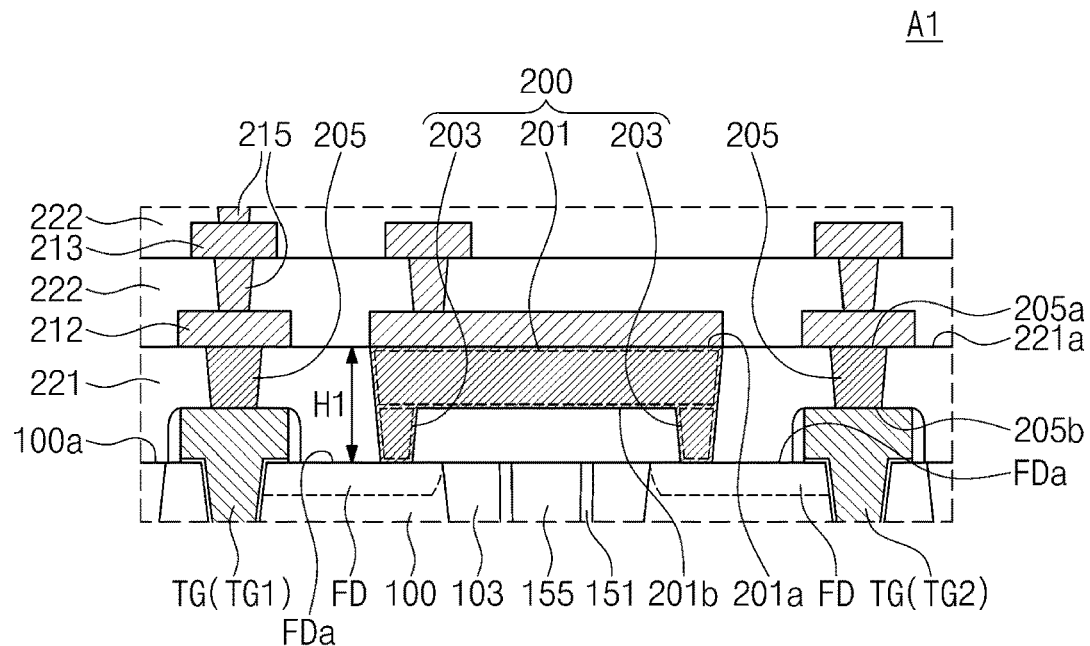
FIG. 8A is an enlarged cross-sectional view of a region A1 of FIG. 5 according to an exemplary embodiment of the present inventive concepts.

FIG. 4 is an enlarged plan view illustrating a region A of FIG. 2. FIG. 5 is a cross-sectional view taken along a line I-I' of FIG. 4. FIG. 8A is an enlarged cross-sectional view of a region A1 of FIG. 5. In the following description, FIGS. 2 and 3 may be referred in conjunction with FIGS. 4, 5, and 8A.

Referring to the exemplary embodiments of FIGS. 4 and 5, an image sensor may include the photoelectric conversion layer 10, the transfer gate TG, the reset gate RG, the dual conversion gate DCG, the selection gate SEL, and the source follower gate SF, the first interconnection layer 20, and the optically-transparent layer 30. The photoelectric conversion layer 10 may include the first substrate 100, the pixel isolation pattern 150, and the device isolation pattern 103.

The first substrate 100 may have a first or front surface 100a and a second or rear surface 100b that are opposite to each other. In an exemplary embodiment, light may be incident into the second surface 100b of the first substrate 100. The first interconnection layer 20 may be disposed on the first surface 100a of the first substrate 100, and the optically-transparent layer 30 may be disposed on the second surface 100b of the first substrate 100. For example, as shown in the exemplary embodiment of FIG. 5, an upper surface of the optically-transparent layer 30 may contact a lower surface of the photoelectric conversion layer 10 and an upper surface of the photoelectric conversion layer 10 may contact a lower surface of the first interconnection layer 20. In an exemplary embodiment, the first substrate 100 may be a semiconductor substrate or a silicon-on-insulator (SOI) substrate. The semiconductor substrate may include, for example, a silicon substrate, a germanium substrate, or a silicon-germanium substrate. The first substrate 100 may include impurities of a first conductivity type. For example, the impurities of the first conductivity type may include p-type impurities, such as aluminum (Al), boron (B), indium (In) and/or gallium (Ga). However, exemplary embodiments of the present inventive concepts are not limited thereto.

The first substrate 100 may include the plurality of unit pixel regions PX defined by the pixel isolation pattern 150. The unit pixel regions PX may be arranged in two different directions (e.g., the first and second directions D1 and D2) to form a matrix-shaped arrangement. The first substrate 100 may include the photoelectric conversion regions 110. The photoelectric conversion regions 110 may be respectively provided in the unit pixel regions PX of the first substrate 100. The photoelectric conversion regions 110 may have the same function as the first to fourth photoelectric conversion regions PD1, PD2, PD3, and PD4 of the exemplary embodiment of FIG. 1. Each of the photoelectric conversion regions 110 may be a region of the first substrate 100 that is doped with impurities of the second conductivity type. The second conductivity type may be different from the first conductivity type. In an exemplary embodiment, the impurities of the second conductivity type may include n-type impurities (e.g., phosphorus, arsenic, bismuth, and/or antimony). The photoelectric conversion regions 110 may be adjacent to the first surface 100a of the first substrate 100. In an exemplary embodiment, the photoelectric conversion regions 110 may be positioned closer to the first surface 100a than to the second surface 100b. As an example, each of the photoelectric conversion regions 110 may include a first region and a second region, which are positioned adjacent to the first surface 100a and the second surface 100b, respectively. For example, as shown in the exemplary embodiment of FIG. 5, the first surface 100a may be positioned adjacent to an upper surface of the photoelectric conversion regions 110 and the second surface 100b may be positioned adjacent to a lower surface of the photoelectric conversion regions 110. There may be a difference in impurity concentration between the first and second regions of the photoelectric conversion region 110. In this exemplary embodiment, the photoelectric conversion region 110 may have a non-vanishing potential gradient between the first and second surfaces 100a and 100b of the first substrate 100. In another exemplary embodiment, the photoelectric conversion region 110 may be configured to have a vanishing potential gradient between the first and second surfaces 100a and 100b of the first substrate 100.

The first substrate 100 and the photoelectric conversion region 110 may constitute a photodiode. For example, the first substrate 100 of the first conductivity type and the photoelectric conversion region 110 of the second conductivity type may form a pn junction serving as the photodiode. The amount of photocharges, which are produced and accumulated in the photoelectric conversion region 110 of the photodiode, may be proportional to an intensity of an incident light.

As shown in the exemplary embodiment of FIG. 4, the pixel isolation pattern 150 may be disposed in the first substrate 100 to define the unit pixel regions PX. For example, the pixel isolation pattern 150 may be disposed between the unit pixel regions PX of the first substrate 100 (e.g., in the first and second directions D1, D2). When viewed in a plan view (e.g., in a plane defined in the first and second directions D1, D2), the pixel isolation pattern 150 may have a lattice or grid structure. When viewed in a plan view, the pixel isolation pattern 150 may be disposed to completely enclose each of the unit pixel regions PX. The pixel isolation pattern 150 may be disposed in a first trench TR1, and the first trench TR1 may be recessed from the first surface 100a of the first substrate 100. The pixel isolation pattern 150 may extend from the first surface 100a of the first substrate 100 towards the second surface 100b. In an exemplary embodiment, the pixel isolation pattern 150 may be a deep trench isolation layer. The pixel isolation pattern 150 may be disposed to penetrate the first substrate 100. A vertical height of the pixel isolation pattern 150 may be substantially equal to a vertical thickness of the first substrate 100. As shown in the exemplary embodiment of FIG. 5, a width of the pixel isolation pattern 150 may gradually decrease from the first surface 100a of the first substrate 100 towards the second surface 100b.

The pixel isolation pattern 150 may include a first isolation pattern 151, a second isolation pattern 153, and a capping pattern 155. The first isolation pattern 151 may be disposed along a lateral side surface of the first trench TR1. In an exemplary embodiment, the first isolation pattern 151 may be formed of or include at least one of, for example, silicon-based insulating materials (e.g., silicon nitride, silicon oxide, and/or silicon oxynitride) and/or high-k dielectric materials (e.g., hafnium oxide and/or aluminum oxide). In an exemplary embodiment, the first isolation pattern 151 may include a plurality of layers formed of different materials. The first isolation pattern 151 may have a lower refractive index than the first substrate 100. In this exemplary embodiment, it may be possible to prevent or suppress a cross-talk issue from occurring between the unit pixel regions PX of the first substrate 100.

The second isolation pattern 153 may be disposed in the first isolation pattern 151. For example, lateral side surfaces of the second isolation pattern 153 may be surrounded by the first isolation pattern 151. The first isolation pattern 151 may be interposed between the second isolation pattern 153 and the first substrate 100. The second isolation pattern 153 may be spaced apart from the first substrate 100 by the first isolation pattern 151. Thus, during an operation of the image sensor, the second isolation pattern 153 may be electrically separated from the first substrate 100. In an exemplary embodiment, the second isolation pattern 153 may be formed of or include a crystalline semiconductor material (e.g., poly silicon). In an exemplary embodiment, the second isolation pattern 153 may further contain dopants of a first or second conductivity type. For example, the second isolation pattern 153 may be formed of or include doped poly silicon. In another exemplary embodiment, the second isolation pattern 153 may be formed of or include an undoped crystalline semiconductor material. For example, the second isolation pattern 153 may be formed of or include undoped poly silicon. Here, the term "undoped" may mean that a doping process is intentionally omitted. The dopants may include n-type dopants and p-type dopants.

The capping pattern 155 may be disposed on a top surface of the second isolation pattern 153. For example, as shown in the exemplary embodiment of FIG. 5, the capping pattern 155 may be disposed adjacent to the first surface 100a of the first substrate 100. A top surface of the capping pattern 155 may be coplanar with the first surface 100a of the first substrate 100. A bottom surface of the capping pattern 155 may contact the top surface of the second isolation pattern 153. For example, the bottom surface of the capping pattern 155 may directly contact the top surface of the second isolation pattern 153. The capping pattern 155 may be formed of or include a non-conductive material. As an example, the capping pattern 155 may be formed of or include at least one of silicon-based insulating materials (e.g., silicon nitride, silicon oxide, and/or silicon oxynitride) and/or high-k dielectric materials (e.g., hafnium oxide and/or aluminum oxide). In this exemplary embodiment, the pixel isolation pattern 150 may prevent photocharges, which are produced by light incident into each of the unit pixel regions PX, from entering adjacent unit pixel regions of the unit pixel regions PX through a random drift phenomenon. For example, the pixel isolation pattern 150 may prevent a cross-talk issue between the unit pixel regions PX.

The device isolation pattern 103 may be disposed in the first substrate 100. For example, the device isolation pattern 103 may be disposed in a second trench TR2, and the second trench TR2 may be recessed from the first surface 100a of the first substrate 100. The device isolation pattern 103 may be a shallow trench isolation (STI) layer. The device isolation pattern 103 may define first active patterns ACT1, second active patterns ACT2, and third active patterns ACT3. A bottom surface of the device isolation pattern 103 may be disposed in the first substrate 100 and may be positioned above the photoelectric conversion regions 110. A width of the device isolation pattern 103 may gradually decrease from the first surface 100a of the first substrate 100 towards the second surface 100b. The bottom surface of the device isolation pattern 103 may be vertically spaced apart from the photoelectric conversion regions 110. The pixel isolation pattern 150 may be overlapped with a portion of the device isolation pattern 103. For example, at least a partial portion of the device isolation pattern 103 may be disposed on and connected to an upper side surface of the pixel isolation pattern 150. The lateral side and bottom surfaces of the device isolation pattern 103 and the lateral side surface of the pixel isolation pattern 150 may be arranged to form a stepwise structure. As shown in the exemplary embodiment of FIG. 5, a depth of the device isolation pattern 103 may be smaller than a depth of the pixel isolation pattern 150. In an exemplary embodiment, the device isolation pattern 103 may be formed of or include at least one compound selected from silicon oxide, silicon nitride, and silicon oxynitride.

Each of the unit pixel regions PX may include the first active pattern ACT1 defined by the device isolation pattern 103. In an exemplary embodiment, the first active pattern ACT1 may have a 'L' shape, when viewed in a plan view. Each of the unit pixel regions PX may also include the second active pattern ACT2 or the third active pattern ACT3.

The second active pattern ACT2 and the third active pattern ACT3 may be defined by the device isolation pattern 103. When viewed in a plan view, each of the second and third active patterns ACT2 and ACT3 may be disposed in an edge region of each of the unit pixel regions PX. For example, as shown in the exemplary embodiment of FIG. 4, the second and third active patterns ACT2 and ACT3 are disposed on a lower edge (e.g., in the first direction D1) of a unit pixel region PX. Each of the second and third active patterns ACT2 and ACT3 may be a line-shaped pattern extending longitudinally in the second direction D2. However, the planar shapes of the first to third active patterns ACT1, ACT2, and ACT3 are not limited to the exemplary embodiment of FIG. 4 and the shapes of the first to third active patterns ACT1, ACT3, and ACT3 may be variously changed in other exemplary embodiments.

The transfer transistor TX, the source follower transistor SX, the reset transistor RX, the dual conversion transistor DCX and the selection transistor AX previously described with reference to FIG. 1 may be disposed on the first surface 100a of the first substrate 100. The transfer transistor TX may be disposed on the first active pattern ACT1 of each of the unit pixel regions PX. The transfer transistor TX may be electrically connected to the photoelectric conversion region 110. The transfer transistor TX may include the transfer gate TG disposed on the first active pattern ACT1 and the floating diffusion region FD. The transfer gate TG may include a lower portion, which is inserted in the first substrate 100 and is disposed below the first surface 100a of the first substrate 100, and an upper portion, which is connected to the lower portion and protrudes above the first surface 100a of the first substrate 100. A gate dielectric layer GI may be interposed between the transfer gate TG and the first substrate 100. The floating diffusion region FD may be disposed in a portion of the first active pattern ACT1 located at one lateral side of the transfer gate TG. The floating diffusion region FD may have a second conductivity type (e.g., n-type) that is different from that of the first substrate 100.

The gate electrodes, such as the transfer gate TG, the selection gate SEL, the source follower gate SF, the dual conversion gate DCG, and the reset gate RG may be disposed on the first surface 100a of the first substrate 100. The source follower transistor SX and the selection transistor AX may be disposed on the second active patterns ACT2 of the unit pixel regions PX. The source follower transistor SX may include the source follower gate SF disposed on the second active pattern ACT2, and the selection transistor AX may include the selection gate SEL. The reset transistor RX and the dual conversion transistor DCX may be disposed on the third active patterns ACT3 of the unit pixel regions PX. The reset transistor RX may include the reset gate RG disposed on the third active pattern ACT3, and the dual conversion transistor DCX may include the dual conversion gate DCG. The gate dielectric layer GI may be interposed between the first substrate 100 and each of the transfer gate TG, the selection gate SEL, the source follower gate SF, the dual conversion gate DCG, and the reset gate RG.

The first interconnection layer 20 may include first and second insulating layers 221 and 222, conductive structures 200, auxiliary conductive patterns 205, first and second interconnection lines 212 and 213, and vias 215. As shown in the exemplary embodiment of FIG. 5, the insulating layers may include a first insulating layer 221 and second insulating layers 222. The first insulating layer 221 may be arranged to cover the first surface 100a of the first substrate 100. For example, a lower surface of the first insulating layer 221 may directly contact the first surface 100a of the first substrate 100. The first insulating layer 221 may be disposed between the first and second interconnection lines 212 and 213 and the first surface 100a of the first substrate 100 to cover the gate electrodes, such as the transfer gate TG, the selection gate SEL, the source follower gate SF, the reset gate RG, and the dual conversion gate DCG. The second insulating layers 222 may be stacked on the first insulating layer 221. In an exemplary embodiment, the first and second insulating layers 221 and 222 may be formed of or include a non-conductive material. For example, the first and second insulating layers 221 and 222 may be formed of or include at least one of silicon-based insulating materials, such as silicon oxide, silicon nitride, and/or silicon oxynitride. However, exemplary embodiments of the present inventive concepts are not limited thereto.

The first and second interconnection lines 212 and 213 may be disposed on the first insulating layer 221. For example, as shown in the exemplary embodiment of FIG. 5, the first and second interconnection lines 212 and 213 may be disposed in the second insulating layers 222, which are disposed on the first insulating layer 221 and are stacked on the first surface 100a of the first substrate 100. The first and second interconnection lines 212 and 213 may be vertically connected to each of the transfer transistors TX, the source follower transistors SX, the reset transistors RX, the dual conversion transistors DCX, and the selection transistors AX through the vias 215 and the auxiliary conductive pattern 205. Electrical signals, which are produced in the photoelectric conversion regions 110, may be transmitted to the outside (e.g., circuit chip). In an exemplary embodiment, the arrangement of the first and second interconnection lines 212 and 213 may be independent of the arrangement of the photoelectric conversion regions 110. For example, the first and second interconnection lines 212 and 213 may be arranged to cross over the photoelectric conversion regions 110. The interconnection lines may include first interconnection lines 212 and second interconnection lines 213. As shown in the exemplary embodiment of FIG. 8, the first interconnection lines 212 may be in direct contact with a top surface of the conductive structure 200 (e.g., the top surface 201a of the connection portion 201 of the conductive structure 200 shown in FIGS. 5 and 8A). The second interconnection lines 213 may be disposed on the first interconnection line 212. In an exemplary embodiment, the first and second interconnection lines 212 and 213 and the vias 215 may be formed of or include a metallic material (e.g., copper (Cu), etc.). The first and second interconnection lines 212 and 213 and the vias 215 may be formed of or include a material that is different from the material of the conductive structure 200. The first and second interconnection lines 212 and 213 and the vias 215 may be electrically connected to the conductive structure 200. The conductive structures 200 and the auxiliary conductive patterns 205 will be described in more detail below.

The optically-transparent layer 30 may include color filters 303 and micro lenses 307. The optically-transparent layer 30 may be configured to collect and filter light, which is incident from the outside, and to provide the light to the photoelectric conversion layer 10.

The color filters 303 and the micro lenses 307 may be disposed on the second surface 100b of the first substrate 100. The color filters 303 may be arranged to correspond to the unit pixel regions PX, respectively. The micro lenses 307 may be disposed on the color filters 303 and arranged to correspond thereto. An anti-reflection layer 132 and first and second insulating layers 134 and 136 may be disposed between the second surface 100b of the first substrate 100 and the color filters 303. The anti-reflection layer 132 may be configured to prevent light, which is incident into the second surface 100b of the first substrate 100, from being reflected so that the light is effectively incident into the photoelectric conversion regions 110. A third insulating layer 305 may be disposed between the color filters 303 and the micro lenses 307.

In an exemplary embodiment, the color filters 303 may include primary color filters. The color filters 303 may include first to third color filters each having a different color from each other. In an exemplary embodiment, the first to third color filters may include green, red, and blue color filters. The first to third color filters may be arranged in a Bayer pattern. In another exemplary embodiment, the first to third color filters may have other colors, such as cyan, magenta, or yellow.

The micro lenses 307 may have a convex shape. In this exemplary embodiment, the micro lenses 307 may more effectively condense light, which is incident into the unit pixel regions PX. When viewed in a plan view, the micro lenses 307 may overlap with the photoelectric conversion regions 110, respectively. The micro lenses 307 may be arranged to correspond to the photoelectric conversion regions 110, respectively.

Figure 11:
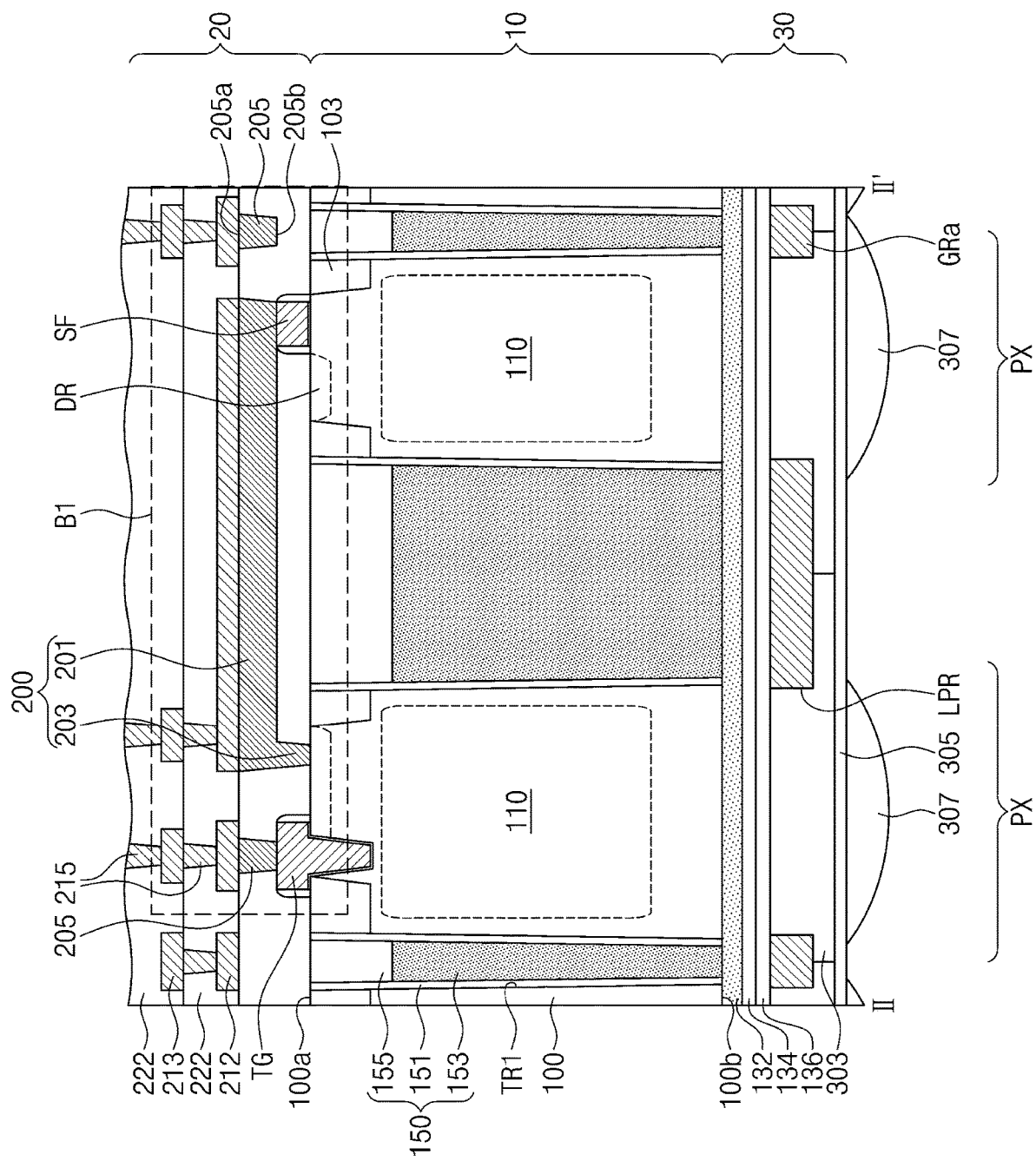
FIG. 11 is a cross-sectional view taken along a line II-II' of FIG. 4 according to an exemplary embodiment of the present inventive concepts.
Figure 13:
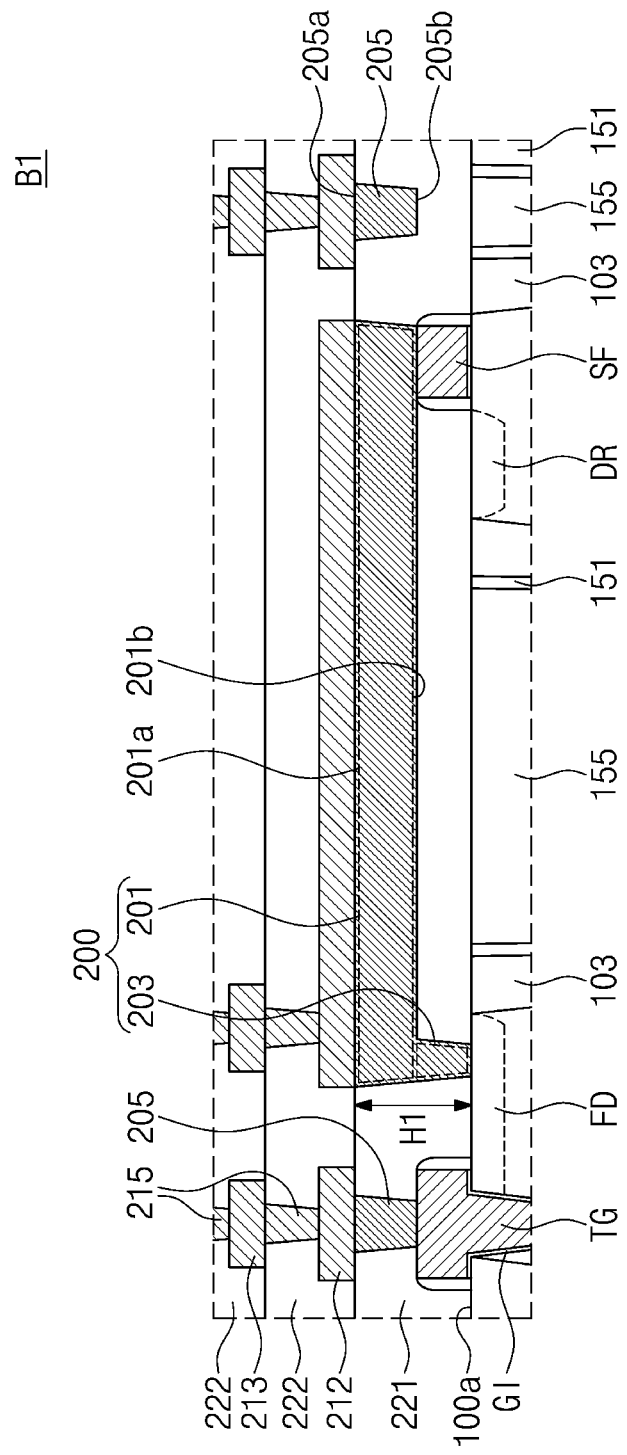
FIG. 13 is an enlarged cross-sectional view of a region B1 of FIG. 11 according to an exemplary embodiment of the present inventive concepts.

FIG. 8A is an enlarged cross-sectional view of a region A1 of FIG. 5. FIG. 11 is a cross-sectional view taken along a line II-II' of FIG. 4. FIG. 13 is an enlarged cross-sectional view of a region B1 of FIG. 11. In the following description, FIGS. 4 and 5 may be referred in conjunction with FIGS. 8A, 11, and 13. Hereinafter, the conductive structure 200 and the auxiliary conductive pattern 205 will be described in more detail.

Referring to the exemplary embodiments of FIGS. 5 and 8A, the conductive structure 200 may be disposed on the first surface 100a of the first substrate 100. The conductive structure 200 may penetrate the first insulating layer 221. The conductive structure 200 may be surrounded by the first insulating layer 221. The conductive structure 200 may be interposed between the second insulating layers 222 and the first surface 100a of the first substrate 100.

The conductive structure 200 may include a connection portion 201 and contacts 203. As shown in the exemplary embodiment of FIG. 5, the connection portion 201 may extend parallel to the first surface 100a of the first substrate 100 and may be spaced apart from the first surface 100a of the first substrate 100. The connection portion 201 may vertically penetrate a partial portion of the first insulating layer 221. For example, the connection portion 201 may vertically penetrate an upper portion of the first insulating layer 221. The top surface 201a of the connection portion 201 may be a top surface of the conductive structure 200. The top surface 201a of the connection portion 201 may be coplanar (e.g., in a thickness direction of the first substrate 100) with a top surface 221a of the first insulating layer 221. The connection portion 201 may be disposed on the contacts 203. For example, a lower portion of the connection portion 201 may directly contact upper portions of the contacts 203. The connection portion 201 may electrically connect the contacts 203 to each other. In the present specification, the expression "to connect elements" may mean a direct connection between the elements or an indirect connection between the elements through another conductive element. The contacts 203 may be disposed on a bottom surface 201b of the connection portion 201. The contacts 203 may be patterns, which are vertically extended from the connection portion 201 towards the first surface 100a of the first substrate 100. The contacts 203 may vertically penetrate a partial portion of the first insulating layer 221. For example, the contacts 203 may vertically penetration a lower portion of the first insulating layer 221. The contacts 203 may be disposed on top surfaces FDa of the floating diffusion regions FD, respectively. Each of the contacts 203 may include two opposite ends (e.g., upper and lower ends), which are connected to the connection portion 201 and the floating diffusion region FD, respectively. The lower portion of the contacts 203 may be in contact with the floating diffusion regions FD, respectively, and may be electrically connected to the floating diffusion regions FD, respectively. Accordingly, the first and second interconnection lines 212 and 213 may be electrically connected to the floating diffusion regions FD through the conductive structure 200.

The top surface of the conductive structure 200 may be coplanar with the top surface 221a of the first insulating layer 221. The lowest surface of the conductive structure 200 may be disposed at the same level as the first surface 100a of the first substrate 100. A first height H1 of the conductive structure 200 may be a vertical distance from the first surface 100a of the first substrate 100 to the top surface of the conductive structure 200. The first height H1 of the conductive structure 200 may be approximately equal to a height of the first insulating layer 221. In an exemplary embodiment, the first height H1 of the conductive structure 200 may range from about 50 nm to about 400 nm. In an exemplary embodiment, the conductive structure 200 may be formed of or include a metal material that is different from the material of the first and second interconnection lines 212 and 213. For example, the conductive structure 200 may be formed of or include tungsten (W).

FIG. 11 is a cross-sectional view taken along a line II-II' of FIG. 4. FIG. 13 is an enlarged cross-sectional view of a region B1 of FIG. 11. Hereinafter, a planar disposition of the conductive structure 200 will be described in more detail with reference to FIGS. 4, 5, 8A, 11, and 13.

Referring to the exemplary embodiment of FIG. 4, the first substrate 100 may include pixel groups PG, each of which includes a plurality of the unit pixel regions PX. The pixel groups PG may be two-dimensionally arranged (e.g., in the first and second directions D1, D2) to form a plurality of rows and a plurality of columns, when viewed in a plan view. As shown in the exemplary embodiment of FIG. 4, the unit pixel regions PX of each of the pixel groups PG may include a first unit pixel region PX1, a second unit pixel region PX2, a third unit pixel region PX3, and a fourth unit pixel region PX4. However, exemplary embodiments of the present inventive concepts are not limited thereto and in other exemplary embodiments, the number of the unit pixel regions of each of the pixel groups PG may vary. The first to fourth unit pixel regions PX1, PX2, PX3, and PX4 may be delimited by the pixel isolation pattern 150. The first to fourth unit pixel regions PX1, PX2, PX3, and PX4 may be two-dimensionally arranged to form two rows and two columns. In an exemplary embodiment, the first and second unit pixel regions PX1 and PX2 may be symmetric to each other about the pixel isolation pattern 150, and the third and fourth unit pixel regions PX3 and PX4 may be symmetric to each other about the pixel isolation pattern 150. Each of the first to fourth unit pixel regions PX1, PX2, PX3, and PX4 may include the floating diffusion region FD. First to fourth transfer gates TG1, TG2, TG3, and TG4 may be disposed in the first to fourth unit pixel regions PX1, PX2, PX3, and PX4, respectively. The first to fourth transfer gates TG1, TG2, TG3, and TG4 may be disposed to be symmetric to each other, with the pixel isolation pattern 150 interposed therebetween, when viewed in a plan view (e.g., in a plane defined in the first and second directions D1, D2).

The contacts 203 of the conductive structure 200 may be disposed in each of the first to fourth unit pixel regions PX1, PX2, PX3, and PX4. For example, the contacts 203 may be disposed on the floating diffusion regions FG, respectively. The contacts 203 may be spaced apart from each other (e.g., in the first and/or second directions D1, D2) with the pixel isolation pattern 150 interposed therebetween and may be coupled to the floating diffusion regions FD, respectively.

The connection portion 201 of the conductive structure 200 may be disposed in the first to fourth unit pixel regions PX1, PX2, PX3, and PX4. The connection portion 201 may extend (e.g., extend longitudinally) in the first or second direction D1 or D2 to connect the contacts 203 to each other. For example, the connection portion 201 may extend in a direction parallel to the first direction D1 to connect the contacts 203 in the first and second unit pixel regions PX1 and PX2 to each other.

Referring to the exemplary embodiments of FIG. 11 and FIG. 4, the connection portion 201 may extend to cross or be parallel to the pixel isolation pattern 150. A partial portion of the connection portion 201 may vertically overlap the pixel isolation pattern 150. The connection portion 201 may extend parallel to the first surface 100a of the first substrate 100 and may be connected to a top surface of at least one of the gate electrodes, such as the transfer gate TG, the selection gate SEL, the source follower gate SF, the dual conversion gate DCG, and the reset gate RG. For example, the connection portion 201 may extend in the second direction D2 and may be connected to the top surface of the source follower gate SF.

Referring to the exemplary embodiment of FIG. 13, the bottom surface 201b of the connection portion 201 may be in contact with the top surface of the source follower gate SF. The bottom surface 201b of the connection portion 201 may be disposed at a level between the top surfaces of the transfer gate TG and the source follower gate SF and the first surface 100a of the first substrate 100. For example, the bottom surface 201b of the connection portion 201 may be located at the same level as the top surface of the source follower gate SF. The connection portion 201 may connect the contact 203 that is connected to the floating diffusion region FD to the source follower gate SF. Therefore, the floating diffusion regions FD may be electrically connected to the source follower gate SF via the contacts 203 and the connection portion 201. However, the planar shape of the connection portion 201 is not limited to the shape shown in the exemplary embodiment of FIG. 4 and the planar shape of the connection portion 201 may be variously changed in other exemplary embodiments.

Referring to the exemplary embodiments of FIGS. 4 and 5, the auxiliary conductive pattern 205 may be disposed on the first surface 100a of the first substrate 100. The auxiliary conductive pattern 205 may extend to face, or be parallel to, a portion of the connection portion 201, when viewed in a plan view. For example, the auxiliary conductive pattern 205 may extend in the first or second direction D1 or D2 to cross the pixel isolation pattern 150 or to be parallel to the pixel isolation pattern 150, when viewed in a plan view. For example, the auxiliary conductive pattern 205 may extend from the top surface of the first transfer gate TG1 to the top surface of the second transfer gate TG2. The auxiliary conductive pattern 205 may be in contact with the top surface of the first transfer gate TG1 and the top surface of the second transfer gate TG2. Therefore, the auxiliary conductive pattern 205 may electrically connect the first transfer gate TG1 and the second transfer gate TG2 to each other.

In an exemplary embodiment, the image sensor may include a plurality of the auxiliary conductive patterns 205. For example, when viewed in a plan view, a pair of the auxiliary conductive patterns 205, which are spaced apart from each other, may be disposed on the first surface 100a of the first substrate 100. The pair of the auxiliary conductive pattern 205 may be spaced apart from each other with the pixel isolation pattern 150 interposed therebetween and with the conductive structure 200 interposed therebetween.

Referring to the exemplary embodiment of FIG. 13, a top surface 205a of the auxiliary conductive pattern 205 may be coplanar with the top surface 221a of the first insulating layer 221. The top surface 205a of the auxiliary conductive pattern 205 may be disposed at the same level as the top surface 201a of the conductive structure 200. A bottom surface 205b of the auxiliary conductive pattern 205 may be disposed at the same level as a top surface of one of the gate electrodes, such as the transfer gate TG, the source follower gate SF, the selection gate SEL, the dual conversion gate DCG, and the reset gate RG. In an exemplary embodiment, the auxiliary conductive patterns 205 may be formed of or include the same material as the conductive structure 200. For example, the auxiliary conductive patterns 205 may be formed of or include at least one of metallic materials (e.g., tungsten (W), etc.

Figure 8B:
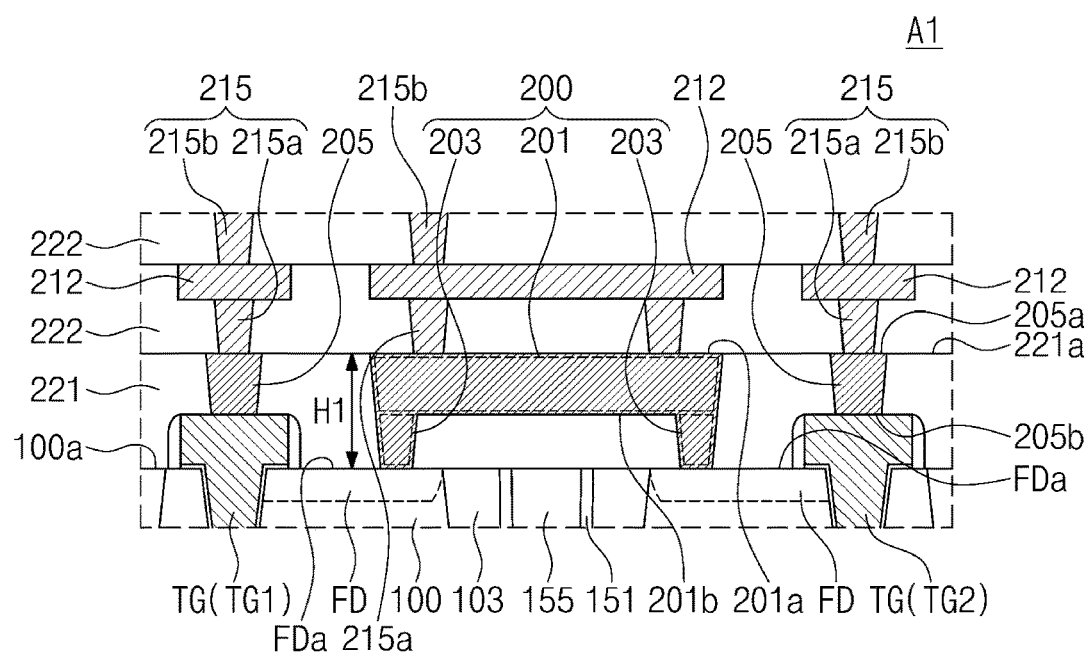
FIG. 8B is an enlarged cross-sectional view illustrating a pixel array region of an image sensor corresponding to a region A1 of FIG. 8A according to an exemplary embodiment of the present inventive concepts.

FIG. 8B is an enlarged cross-sectional view illustrating a pixel array region of an image sensor according to an exemplary embodiment of the present inventive concepts and corresponding to a region A1 of FIG. 8A.

Referring to FIG. 8B, in an image sensor according to an exemplary embodiment of the present inventive concepts, the first interconnection layer 20 may include the first and second insulating layers 221 and 222, the conductive structures 200, the auxiliary conductive patterns 205, the first interconnection lines 212 and the vias 215. The conductive structures 200 and the auxiliary conductive patterns 205 may be configured to have substantially the same features as those described with reference to FIGS. 4 and 5. The following description will be focused on different features from the previous exemplary embodiments and a description of substantially identical elements may be omitted for convenience of explanation.

The insulating layers may include the first insulating layer 221 and the second insulating layers 222. The first insulating layer 221 may be substantially the same to the first insulating layer 221 described with reference to the exemplary embodiments of FIGS. 4 and 5. The first interconnection lines 212 may be disposed on the first insulating layer 221. For example, the first interconnection lines 212 may be disposed in the second insulating layers 222. Top surfaces of the first interconnection lines 212 may be coplanar with a top surface of the second insulating layers 222.

The vias 215 may be disposed on the first insulating layer 221. The vias 215 may include first vias 215a and second vias 215b. The first vias 215a may be disposed on the conductive structure 200 and the auxiliary conductive patterns 205, respectively. For example, as shown in the exemplary embodiment of FIG. 8B, a lower surface of the first vias 215a may directly contact an upper surface of the conductive structure 200 or an upper surface of the auxiliary conductive patterns 205. For example, the first vias 215a may be disposed between the conductive structure 200 and the first interconnection lines 212 and between the auxiliary conductive pattern 205 and the first interconnection lines 212. The first vias 215a may be in contact with the top surface 201a of the conductive structure 200 and the bottom surfaces of the first interconnection lines 212. Therefore, the first vias 215a may electrically connect the conductive structure 200 to the first interconnection lines 212. The first vias 215a may be in contact with the top surface 205a of the auxiliary conductive pattern 205 and the bottom surface of the first interconnection lines 212. Therefore, the first vias 215a may electrically connect the auxiliary conductive pattern 205 to the interconnection lines 212. The second vias 215b may be disposed between the first interconnection lines 212. Therefore, the first interconnection lines 212 may be electrically connected to each other through the second vias 215b.

Figure 6:
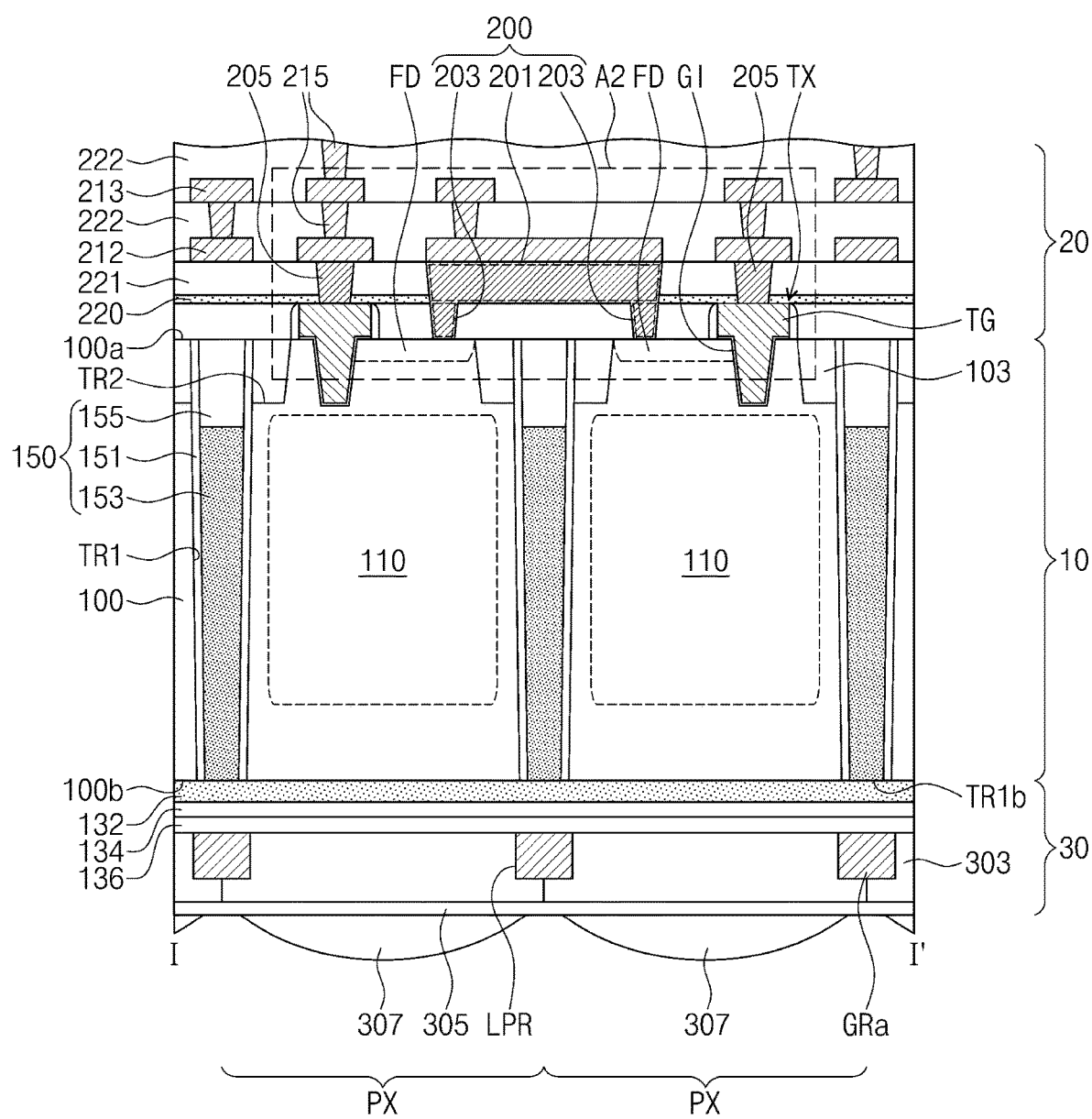
FIG. 6 is a cross-sectional view taken along the line of FIG. 4 illustrating a pixel array region of an image sensor according to an exemplary embodiment of the present inventive concepts.
Figure 9:
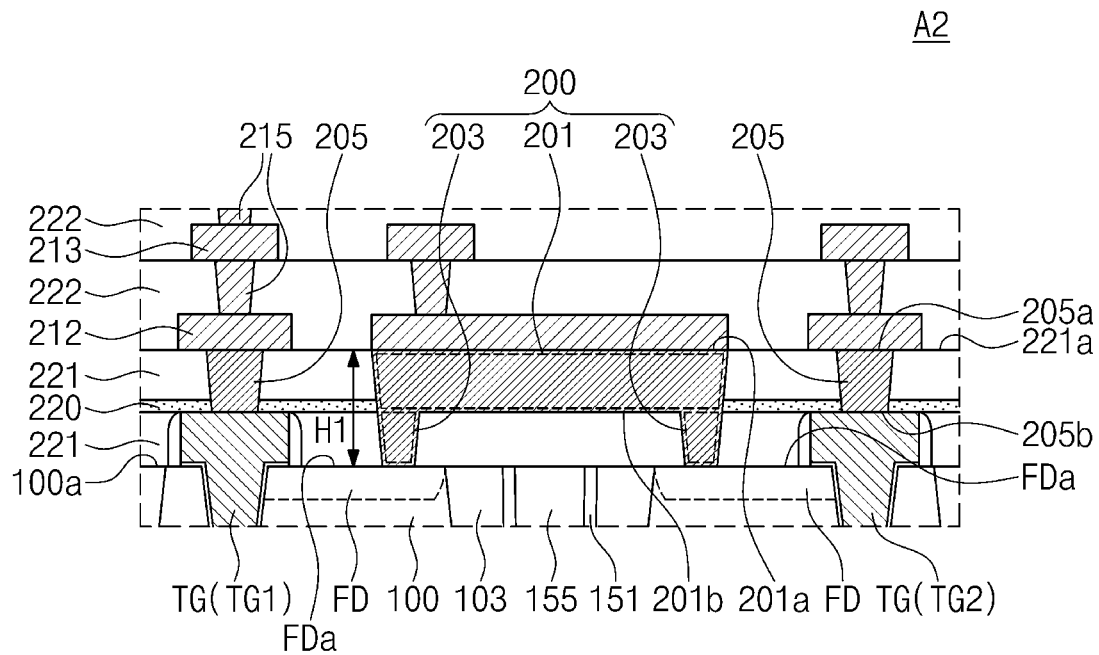
FIG. 9 is an enlarged cross-sectional view of a region A2 of FIG. 6 according to an exemplary embodiment of the present inventive concepts.
Figure 12:
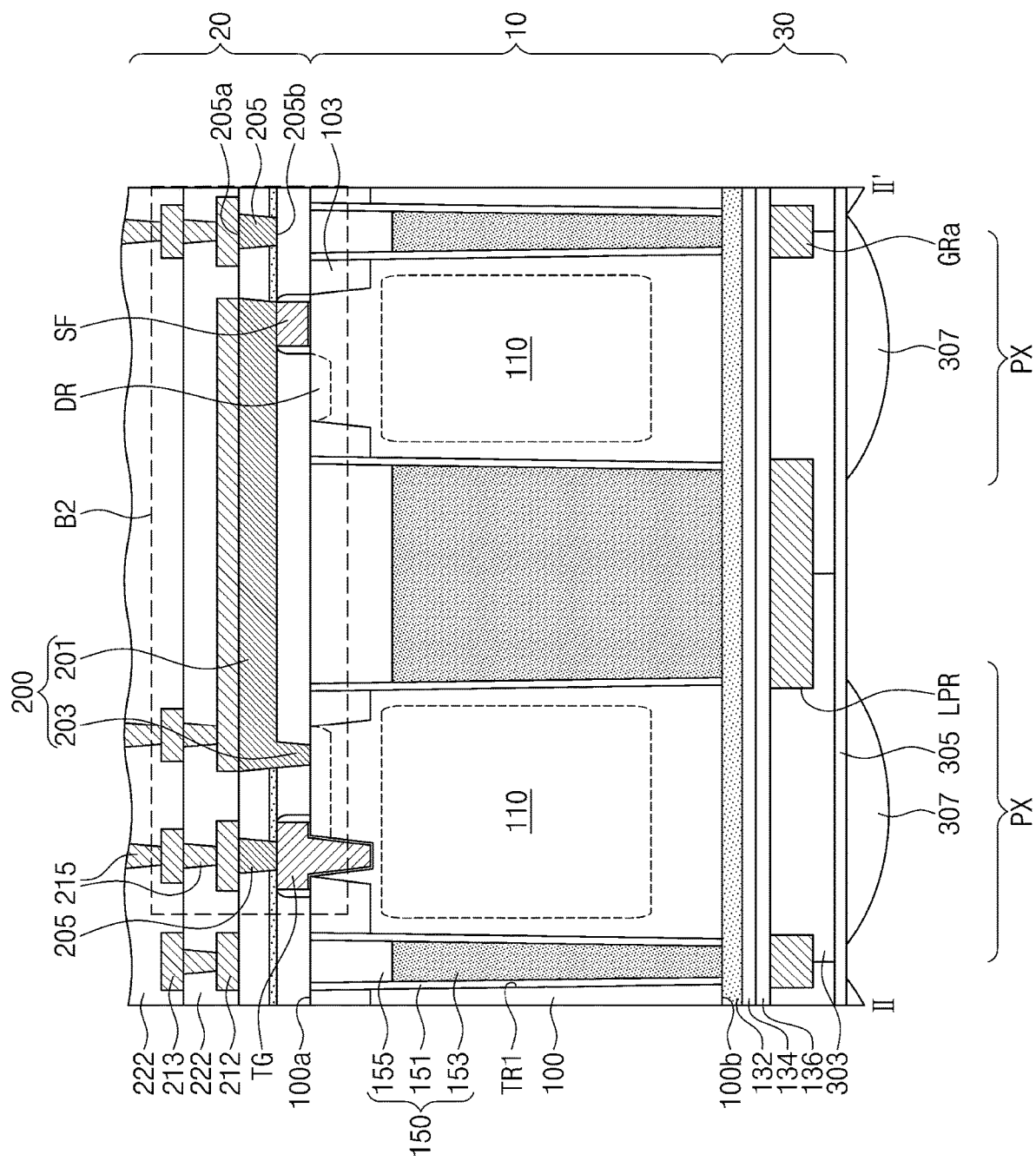
FIG. 12 is a cross-sectional view taken along the line II-II' of FIG. 4 illustrating a pixel array region of an image sensor according to an exemplary embodiment of the present inventive concepts.
Figure 14:
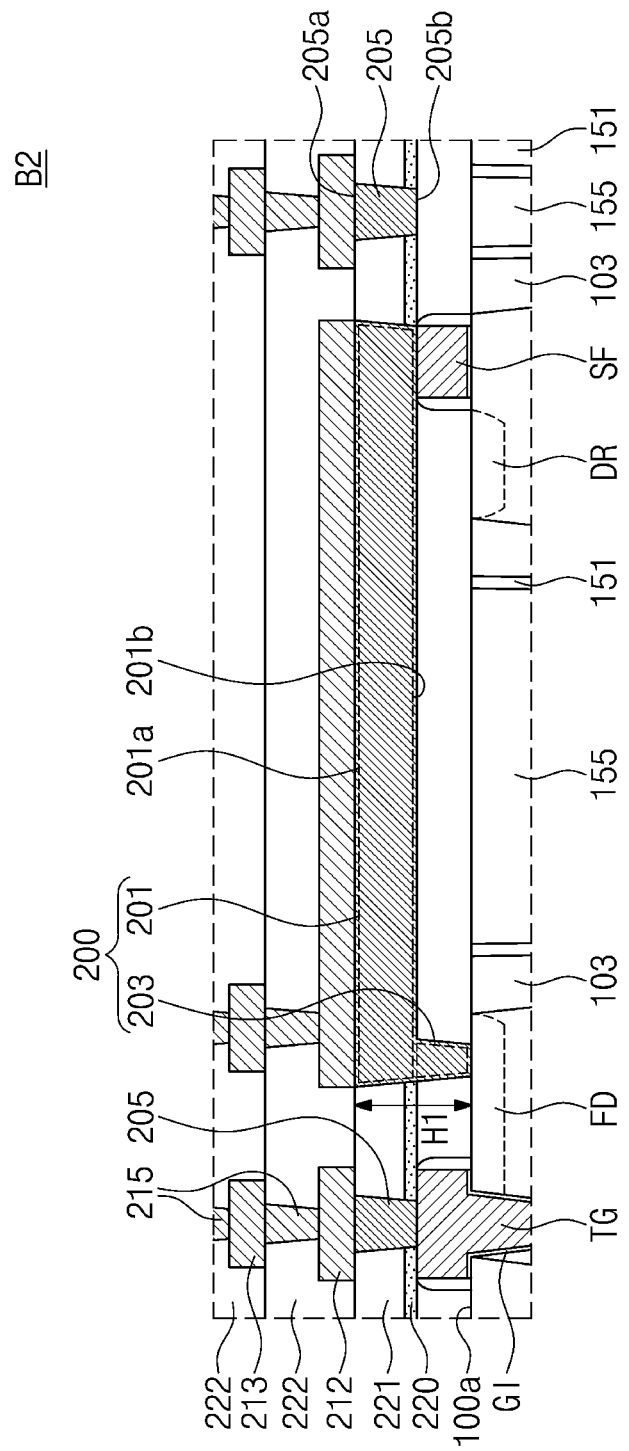
FIG. 14 is an enlarged cross-sectional view of a region B2 of FIG. 12 according to an exemplary embodiment of the present inventive concepts.

FIG. 6 is a cross-sectional view, which is taken along line I-I' of FIG. 4 to illustrate a pixel array region of an image sensor according to an exemplary embodiment of the present inventive concepts. FIG. 9 is an enlarged cross-sectional view of a region A2 of FIG. 6. FIG. 12 is a cross-sectional view, which is taken along the line II-II' of FIG. 4 to illustrate a pixel array region of an image sensor according to an exemplary embodiment of the present inventive concepts. FIG. 14 is an enlarged cross-sectional view of a region B2 of FIG. 12. For concise description, an element described above may be identified by the same reference number without repeating an overlapping description thereof.

Referring to the exemplary embodiments of FIGS. 6, 9, 12, and 14, an image sensor may include the photoelectric conversion layer 10, the first interconnection layer 20, and the optically-transparent layer 30. The photoelectric conversion layer 10 and the optically-transparent layer 30 may be configured to have substantially the same features as those described with reference to the exemplary embodiments of FIGS. 2 to 5.

The first interconnection layer 20 may further include an etch stop layer 220, in addition to the first and second insulating layers 221 and 222, the conductive structures 200, the auxiliary conductive patterns 205, the first and second interconnection lines 212 and 213, and the vias 215. The first and second insulating layers 221 and 222, the auxiliary conductive patterns 205, the first and second interconnection lines 212 and 213 and the vias 215 may be configured to have substantially the same features as those described with reference to the exemplary embodiments of FIGS. 4 and 5.

The etch stop layer 220 may be disposed on the first surface 100a of the first substrate 100. The etch stop layer 220 may be disposed in the first insulating layer 221 and may extend (e.g., extend longitudinally) in a direction parallel to the first surface 100a. In an exemplary embodiment, the etch stop layer 220 may be disposed on the top surfaces of the transfer gates TG. For example, as shown in the exemplary embodiment of FIG. 6, a bottom surface of the etch stop layer 220 may be in direct contact with the top surfaces of the transfer gates TG. In an exemplary embodiment, the etch stop layer 220 may be formed of or include a material having an etch selectivity with respect to the first and second insulating layers 221 and 222. The etch stop layer 220 may be formed of or include, for example, silicon carbon nitride (SiCN). However, exemplary embodiments of the present inventive concepts are not limited thereto.

The conductive structure 200 may penetrate the etch stop layer 220. For example, the connection portion 201 of the conductive structure 200 may penetrate the etch stop layer 220. The bottom surface 201b of the connection portion 201 may be disposed at the same level as the bottom surface of the etch stop layer 220. The auxiliary conductive pattern 205 may also be disposed to penetrate the etch stop layer 220. The bottom surface 205b of the auxiliary conductive pattern 205 may be disposed at the same level as the bottom surface of the etch stop layer 220. The bottom surface 205b of the auxiliary conductive pattern 205 may be in direct contact with the top surface of the transfer gate TG and may be disposed in the first insulating layer 221. However, exemplary embodiments of the present inventive concepts are not limited thereto.

Referring to the exemplary embodiments of FIGS. 12 and 14, the etch stop layer 220 may be disposed on the first surface 100a of the first substrate 100. In an exemplary embodiment, the etch stop layer 220 may be disposed directly on the top surface of the transfer gates TG and the top surface of the source follower gate SF. The bottom surface of the etch stop layer 220 may be in direct contact with the top surfaces of the transfer gates TG. In an exemplary embodiment, the etch stop layer 220 may be formed of or include a material having an etch selectivity with respect to the first and second insulating layers 221 and 222. The etch stop layer 220 may be formed of or include, for example, silicon carbon nitride (SiCN).

The contacts 203 of the conductive structure 200 may penetrate the etch stop layer 220 and may be connected to the floating diffusion region FD. A bottom surface of the connection portion 201 of the conductive structure 200 may penetrate the etch stop layer 220 and may be connected to the top surface of the source follower gate SF. The bottom surface 201b of the connection portion 201 may be disposed at the same level as the bottom surface of the etch stop layer 220. The bottom surface 205b of the auxiliary conductive pattern 205 may be provided at the same level as the bottom surface of the etch stop layer 220. The bottom surface 205b of the auxiliary conductive pattern 205 may be in direct contact with the top surface of the transfer gate TG and may be disposed in the first insulating layer 221.

Figure 7:
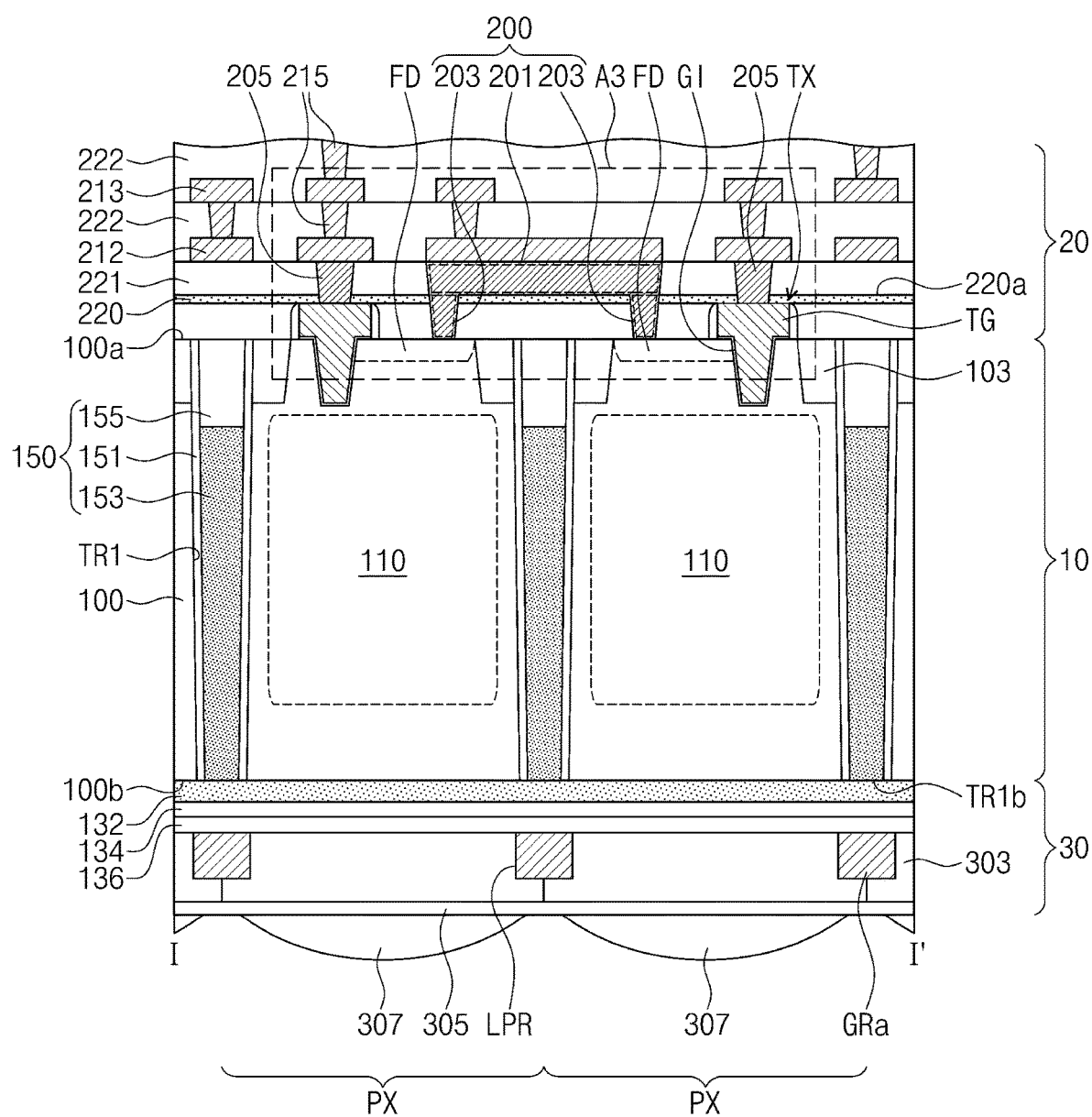
FIG. 7 is a cross-sectional view taken along the line I-I' of FIG. 4 illustrating a pixel array region of an image sensor according to an exemplary embodiment of the present inventive concepts.
Figure 10:
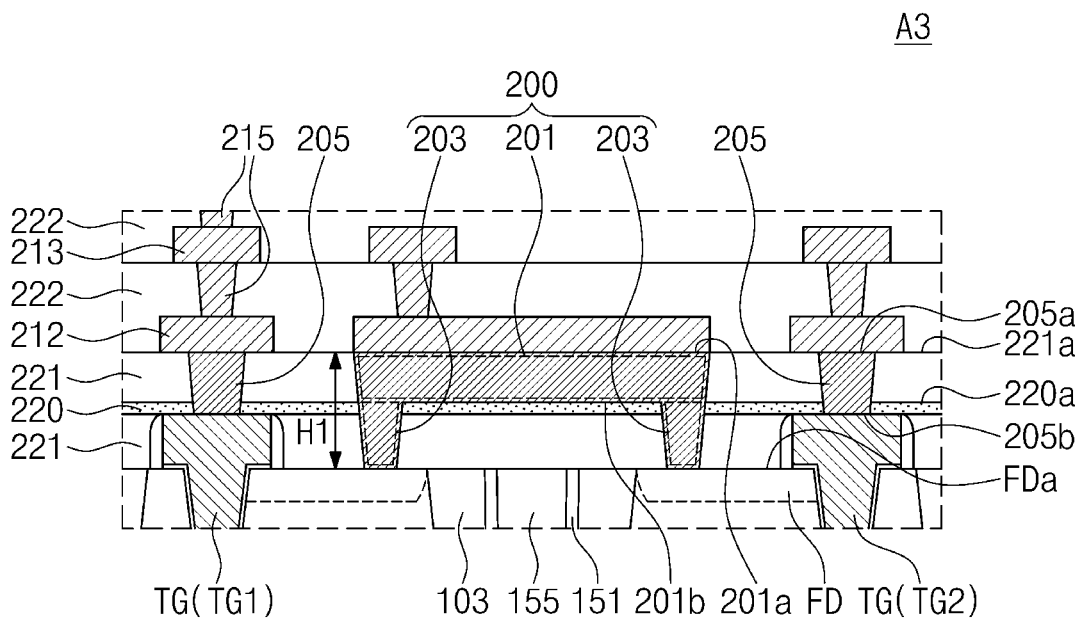
FIG. 10 is an enlarged cross-sectional view of a region A3 of FIG. 7 according to an exemplary embodiment of the present inventive concepts.

FIG. 7 is a cross-sectional view, which is taken along the line 14 of FIG. 4 to illustrate a pixel array region of an image sensor according to an exemplary embodiment of the present inventive concepts. FIG. 10 is an enlarged cross-sectional view of a region A3 of FIG. 7. For concise description, an element described above may be identified by the same reference number without repeating an overlapping description thereof.

Referring to the exemplary embodiments of FIGS. 7 and 10, an image sensor may include the photoelectric conversion layer 10, the first interconnection layer 20, and the optically-transparent layer 30. The photoelectric conversion layer 10 and the optically-transparent layer 30 may be configured to have substantially the same features as those described with reference to the exemplary embodiments of FIGS. 2 to 5.

The first interconnection layer 20 may further include the etch stop layer 220, in addition to the first and second insulating layers 221 and 222, the conductive structures 200, the auxiliary conductive patterns 205, the first and second interconnection lines 212 and 213, and the vias 215. The first and second insulating layers 221 and 222, the auxiliary conductive patterns 205, the first and second interconnection lines 212 and 213 and the vias 215 may be configured to have substantially the same features as those described with reference to the exemplary embodiments of FIGS. 4 and 5.

The etch stop layer 220 may be disposed on the first surface 100a of the first substrate 100. The etch stop layer 220 may be disposed in the first insulating layer 221 and may extend in a direction parallel to the first surface 100a. The conductive structure 200 may penetrate the etch stop layer 220. For example, as shown in the exemplary embodiment of FIG. 7, the contacts 203 of the conductive structure 200 may penetrate the etch stop layer 220. The bottom surface 201b of the connection portion 201 may be disposed at the same level as a top surface of the etch stop layer 220 in contrast to the exemplary embodiment of FIG. 6. The auxiliary conductive pattern 205 may be disposed to penetrate the etch stop layer 220. Therefore, the bottom surface 201b of the connection portion 201 may be positioned at a level that is higher than the bottom surface of the auxiliary conductive pattern 205.

FIGS. 15 to 23 are cross-sectional views illustrating a method of fabricating an image sensor according to exemplary embodiments of the present inventive concept, taken along the line I-I' of FIG. 4.

Figure 15:
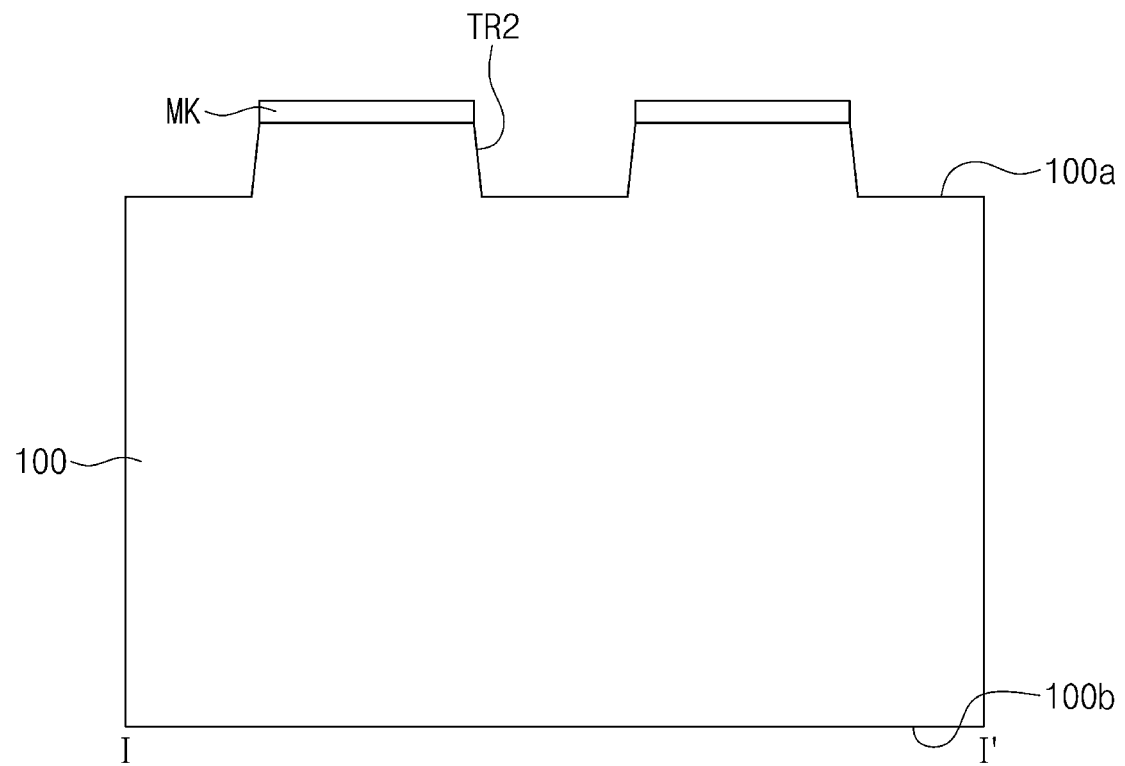
FIGS. 15 to 23 are cross-sectional views illustrating a method of fabricating an image sensor taken along the line I-I' of FIG. 4 according to exemplary embodiments of the present inventive concepts.

Referring to the exemplary embodiments of FIG. 15 and FIG. 3, the first substrate 100 may be prepared having two opposite surfaces, such as the first and second surfaces 100a and 100b which may be front and rear surfaces, respectively. The first substrate 100 may include the pixel array region AR, the optical black region OB, and a pad region PR which are spaced apart from each other (e.g., in the second direction D2). The first substrate 100 may contain impurities of the first conductivity type (e.g., p-type). As an example, the first substrate 100 may have a bulk silicon wafer (e.g., of the first conductivity type) and an epitaxial layer (e.g., of the first conductivity type) formed on the bulk silicon wafer. In another exemplary embodiment, the first substrate 100 may be a bulk substrate, in which a well of the first conductivity type is formed.

As shown in the exemplary embodiment of FIG. 15, the second trench TR2 may be formed on the first surface 100a of the first substrate 100. The formation of the second trench TR2 may include forming a mask pattern MK on the first surface 100a of the first substrate 100 and performing an etching process on the first surface 100a using the mask pattern MK.

Figure 16:
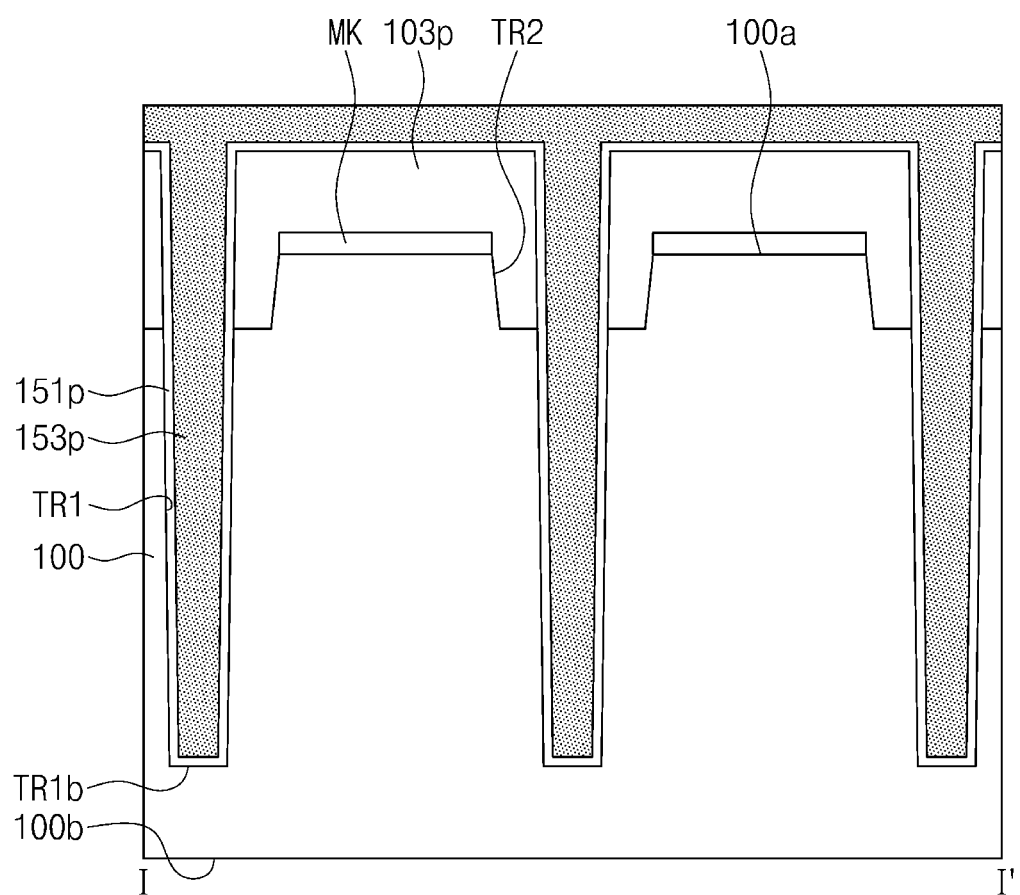
Figure 17:
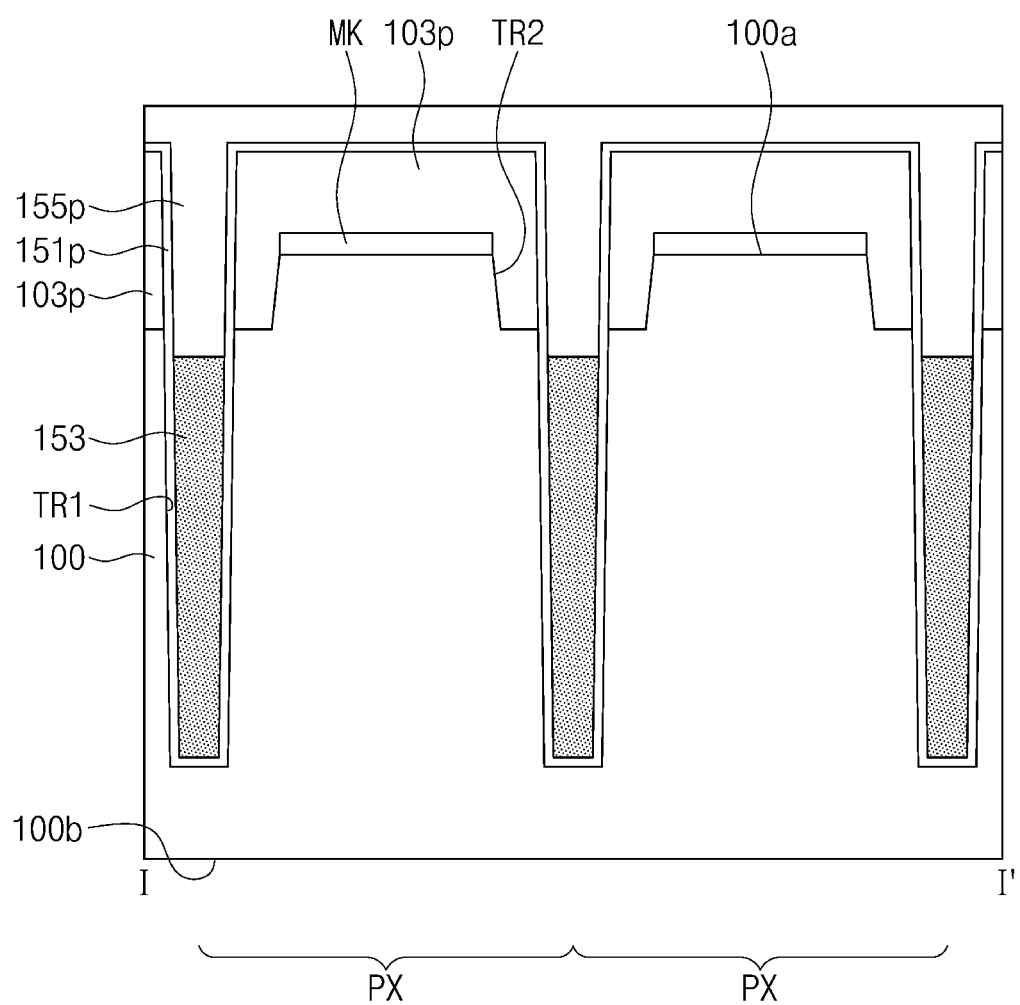

Referring to the exemplary embodiment of FIG. 16, the first trench TR1 may be formed in the first substrate 100 and may extend through the first surface 100a towards the second surface 100b. In an exemplary embodiment, a second preliminary isolation pattern 103p may be formed on the first surface 100a of the first substrate 100, before the formation of the first trench TR1. In an exemplary embodiment, the second preliminary isolation pattern 103p may be formed by performing a deposition process on the first surface 100a of the first substrate 100. The second preliminary isolation pattern 103p may be formed to fully fill the second trench TR2 and to cover the mask pattern MK. A top surface of the second preliminary isolation pattern 103p may be formed at a level that is higher than the first surface 100a of the first substrate 100. In an exemplary embodiment, the first trench TR1 may be formed by forming a mask on the second preliminary isolation pattern 103p and then anisotropically etching the second preliminary isolation pattern 103p and the first substrate 100. A bottom surface TR1b of the first trench TR1 may be located at a level higher than the second surface 100b of the first substrate 100. In an exemplary embodiment, the second preliminary isolation pattern 103p may be formed of or include at least one compound selected from, for example, silicon oxide, silicon nitride, and silicon oxynitride.

After the formation of the first trench TR1, a first preliminary isolation pattern 151p may be formed to conformally cover an inner surface of the first trench TR1, such as lateral edges and the bottom surface of the first trench TR1. The first preliminary isolation pattern 151p may cover the inner surface of the first trench TR1 and lateral edges and the top surface of the second preliminary isolation pattern 103p.

In an exemplary embodiment, the first preliminary isolation pattern 151p may be formed by depositing an insulating material on the first substrate 100 with the first trench TR1. In an exemplary embodiment, the first preliminary isolation pattern 151p may be formed of or include at least one compound selected from silicon oxide, silicon nitride, and silicon oxynitride.

A second preliminary isolation pattern 153p may be formed on the first preliminary isolation pattern 151p. In an exemplary embodiment, the second preliminary isolation pattern 153p may be formed by performing a deposition process on the first substrate 100 provided with the first preliminary isolation pattern 151p. The second preliminary isolation pattern 153p may be formed to fill the first trench TR1 covered with the first preliminary isolation pattern 151p and to cover the top surface of the second preliminary isolation pattern 103p covered with the first preliminary isolation pattern 151p. In an exemplary embodiment, the second preliminary isolation pattern 153p may be formed of or include, for example, poly silicon. Referring to the exemplary embodiment of FIG. 17, a first etching process may be performed to remove an upper portion of the second preliminary isolation pattern 153p. The second isolation pattern 153 may be formed by removing the upper portion of the second preliminary isolation pattern 153p and a portion of the first preliminary isolation pattern 151p may be exposed to the outside. The first etching process may lower the top surface of the second isolation pattern 153 to a level that is lower than a bottom surface of the second preliminary isolation pattern 103p.

According to an exemplary embodiment, a doping process may be performed on the second isolation pattern 153, after the first etching process. In an exemplary embodiment, the doping process may be, for example, a beam-line ion implantation process or a plasma doping (PLAD) process. However, exemplary embodiments of the present inventive concepts are not limited thereto. In the exemplary embodiment in which the doping process is a plasma doping process, a source material in a gaseous state may be supplied into a process chamber. The source material may then be ionized to form a plasma, and the ionized source materials may be injected into the second isolation pattern 153 by applying a bias of high voltage to an electrostatic chuck provided with the first substrate 100. By using the plasma doping process, a uniform doping profile may be formed even at a deep level and a process time for the doping process may be reduced. In an exemplary embodiment in which the doping process is a beam-line ion implantation process, it may be difficult to reduce a vertical variation in doping concentration of the second isolation pattern 153 due to the first trench TR1 having a relatively small width and a relatively large depth. Accordingly, in an exemplary embodiment in which the doping process is performed using the beam-line ion implantation process, a concentration of impurities in the second isolation pattern 153 may vary depending on a vertical depth.

A preliminary capping pattern 155p may be formed to fully cover the first substrate 100 and to fill an upper portion of the first trench TR1. A lower surface of the preliminary capping pattern 155p may directly contact an upper surface of the second isolation pattern 153. The forming of the preliminary capping pattern 155p may include performing a deposition process on the first surface 100a of the first substrate 100. In an exemplary embodiment, the preliminary capping pattern 155p may be formed of or include silicon oxide, silicon nitride, and/or silicon oxynitride.

Figure 18:
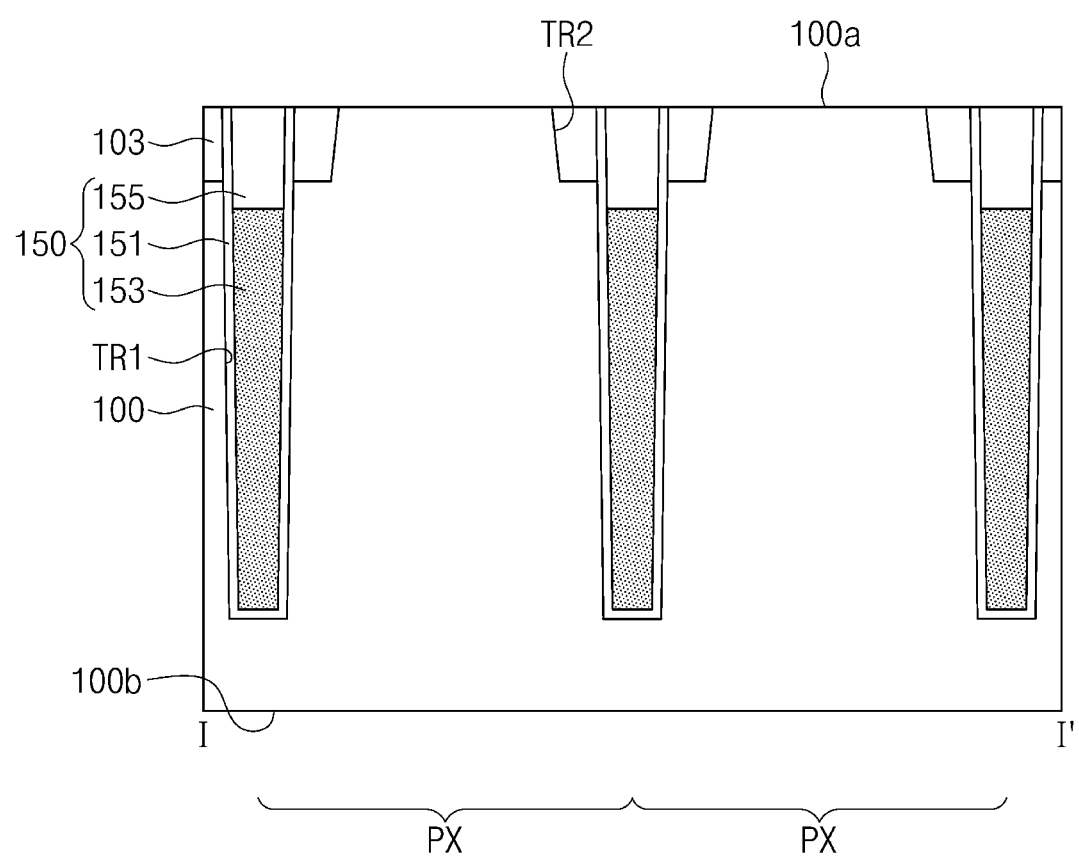

Referring to the exemplary embodiment of FIG. 18, the capping pattern 155 and the device isolation pattern 103 may be formed. The formation of the capping pattern 155 and the device isolation pattern 103 may include performing a planarization process on the first surface 100a of the first substrate 100. In an exemplary embodiment, the mask pattern MK may be removed after the planarization process. Therefore, the first surface 100a of the first substrate 100 may be prevented from being damaged by the planarization process.

Figure 19:
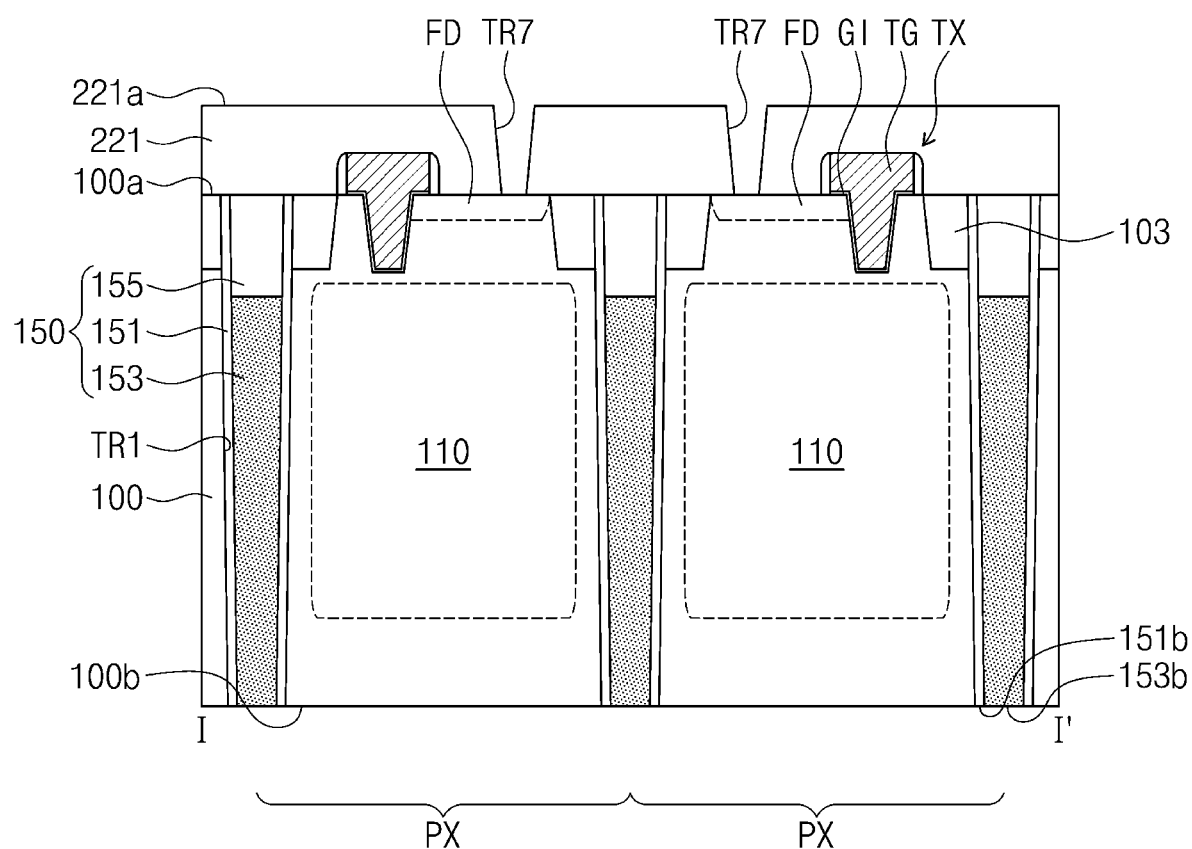

Referring to the exemplary embodiment of FIG. 19, the photoelectric conversion regions 110 may be formed in the unit pixel regions PX, respectively, by an impurity doping process. The photoelectric conversion regions 110 may be formed to have a second conductivity type (e.g., n-type), which is different from the first conductivity type (e.g., p-type). In an exemplary embodiment, a thinning process may be performed to remove a portion of the first substrate 100 or to reduce a vertical thickness of the first substrate 100. The thinning process may include grinding or polishing the second surface 100b of the first substrate 100 and anisotropically or isotropically etching the second surface 100b of the first substrate 100. In an exemplary embodiment, the first substrate 100 may be inverted for the thinning of the first substrate 100. In an exemplary embodiment, the grinding or polishing process may be performed to remove a portion of the first substrate 100, and then, an anisotropic or isotropic etching process may be performed to remove surface defects from the first substrate 100.

The thinning process on the second surface 100b of the first substrate 100 may be performed to expose bottom surfaces 151b and 153b of the first and second isolation patterns 151 and 153. For example, after the thinning process, the bottom surfaces 151b and 153b of the first and second isolation patterns 151 and 153 may be located at substantially the same level as the second surface 100b of the first substrate 100.

Thereafter, the transfer transistor TX may be formed on the first active pattern ACT1 of each of the unit pixel regions PX, the source follower transistor SX and the selection transistor AX may be formed on the second active pattern ACT2, and the reset transistor RX and the dual conversion transistor DCX may be formed on the third active pattern ACT3.

For example, the formation of the transfer transistor TX may include doping the first active pattern ACT1 to form the floating diffusion region FD and forming the transfer gate TG on the first active pattern ACT1. The formation of the source follower transistor SX and the selection transistor AX may include doping the second active pattern ACT2 to form impurity regions and forming the source follower gate SF and the selection gate SEL on the second active pattern ACT2. The formation of the reset transistor RX and the dual conversion transistor DCX may include doping the third active pattern ACT3 to form impurity regions and forming the reset gate RG and the dual conversion gate DCG on the third active pattern ACT3.

Referring to the exemplary embodiment of FIG. 19, the first insulating layer 221 may be formed on the first surface 100a of the first substrate 100. The first insulating layer 221 may be arranged to cover the transfer transistor TX, the source follower transistor SX, the reset transistor RX, the dual conversion transistor DCX, and the selection transistor AX, which are formed on the first surface 100a of the first substrate 100.

An etching process may be performed on a top surface of the first insulating layer 221 to form seventh trenches TR7.

The seventh trenches TR7 may be formed to penetrate the first insulating layer 221 and to expose the first surface 100a of the first substrate 100. For example, each of the seventh trenches TR7 may be formed on the floating diffusion region FD to expose a portion (e.g., an upper surface) of the floating diffusion region FD.

Figure 20:
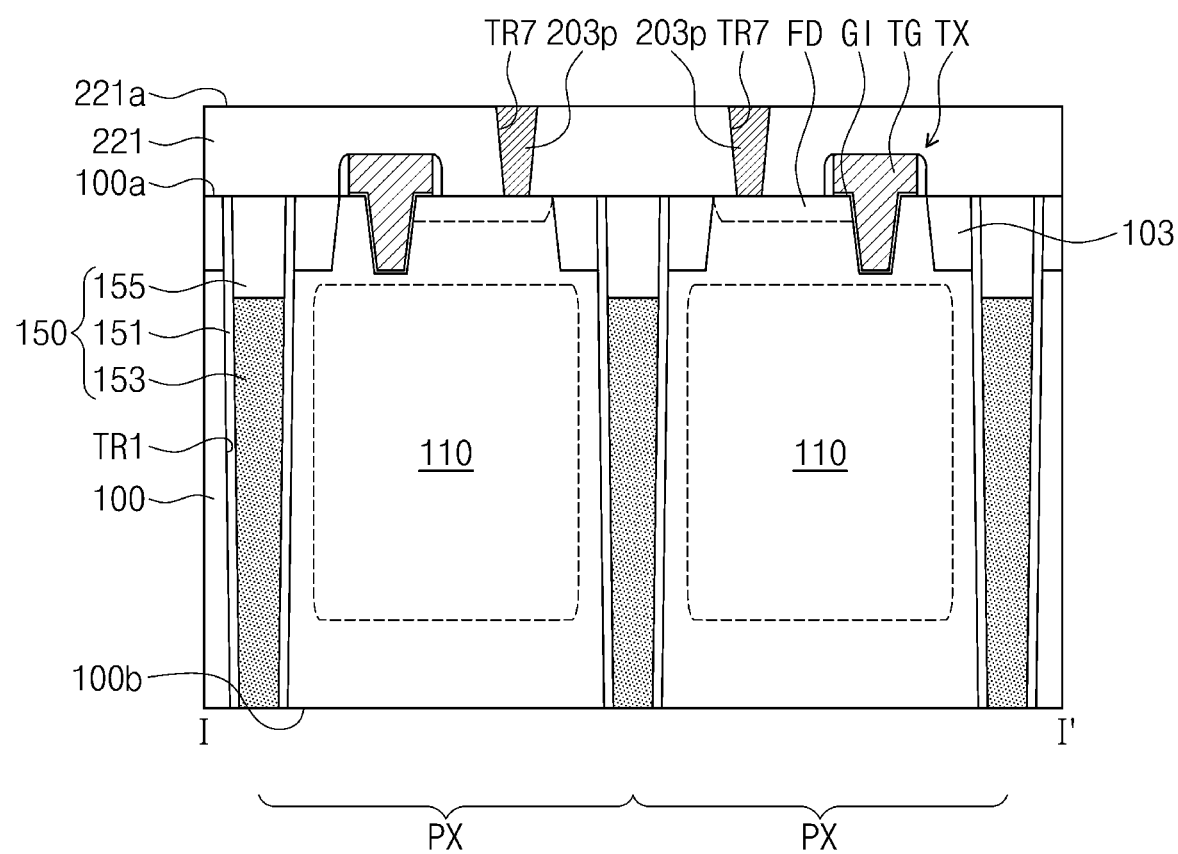

Referring to the exemplary embodiment of FIG. 20, preliminary contacts 203p may be formed on the first surface 100a of the first substrate 100. The preliminary contacts 203p may be disposed in the seventh trenches TR7, respectively, and in an exemplary embodiment, the preliminary contacts 203p may be disposed to fill the seventh trenches TR7. A polishing process may be performed on the top surface 221a of the first insulating layer 221. As a result of the polishing process, the preliminary contacts 203p may be formed to have top surfaces that are coplanar with the top surface 221a of the first insulating layer 221. In an exemplary embodiment, the preliminary contacts 203p may be formed of or include a conductive material (e.g., tungsten (W), etc.).

Figure 21:
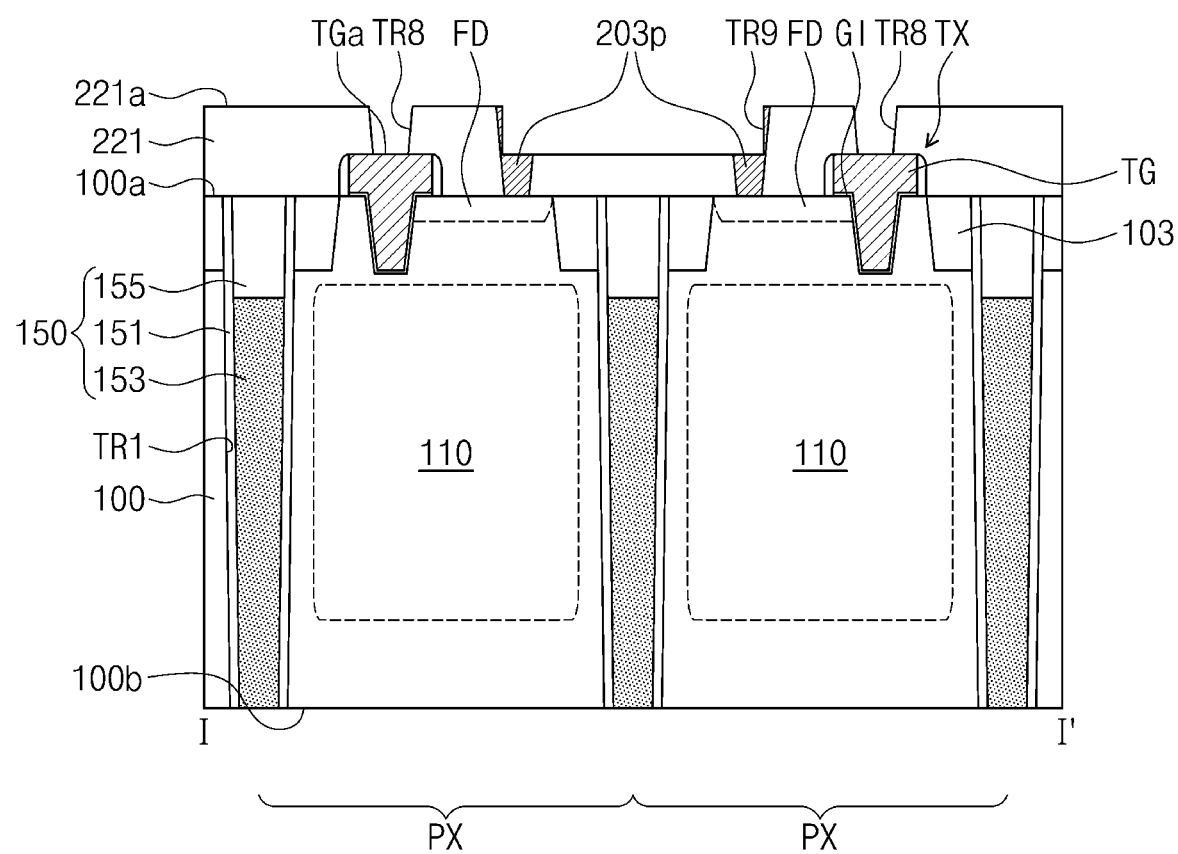

Referring to the exemplary embodiment of FIG. 21, an etching process may be performed on the top surface 221a of the first insulating layer 221 to form eighth trenches TR8 and a ninth trench TR9 disposed between the eighth trenches TR8. In an exemplary embodiment, the eighth trenches TR8 and the ninth trench TR9 may be formed concurrently by a single process or separately by at least two independent processes. The first insulating layer 221 and the preliminary contacts 203p may be partially removed by the etching process. The eighth trenches TR8 may be formed on a top surface TGa of the transfer gate TG to expose the top surface TGa of the transfer gate TG. The ninth trench TR9 may be disposed on the preliminary contacts 203p and may expose a top surface of the preliminary contacts 203p. A bottom surface of the ninth trench TR9 may extend parallel to the first surface 100a of the first substrate 100. The bottom surface of the ninth trench TR9 may be disposed in the first insulating layer 221. In an exemplary embodiment, the bottom surface of the ninth trench TR9 may be positioned at a level between the top surface TGa of the transfer gate TG and the first surface 100a of the first substrate 100.

Figure 22:
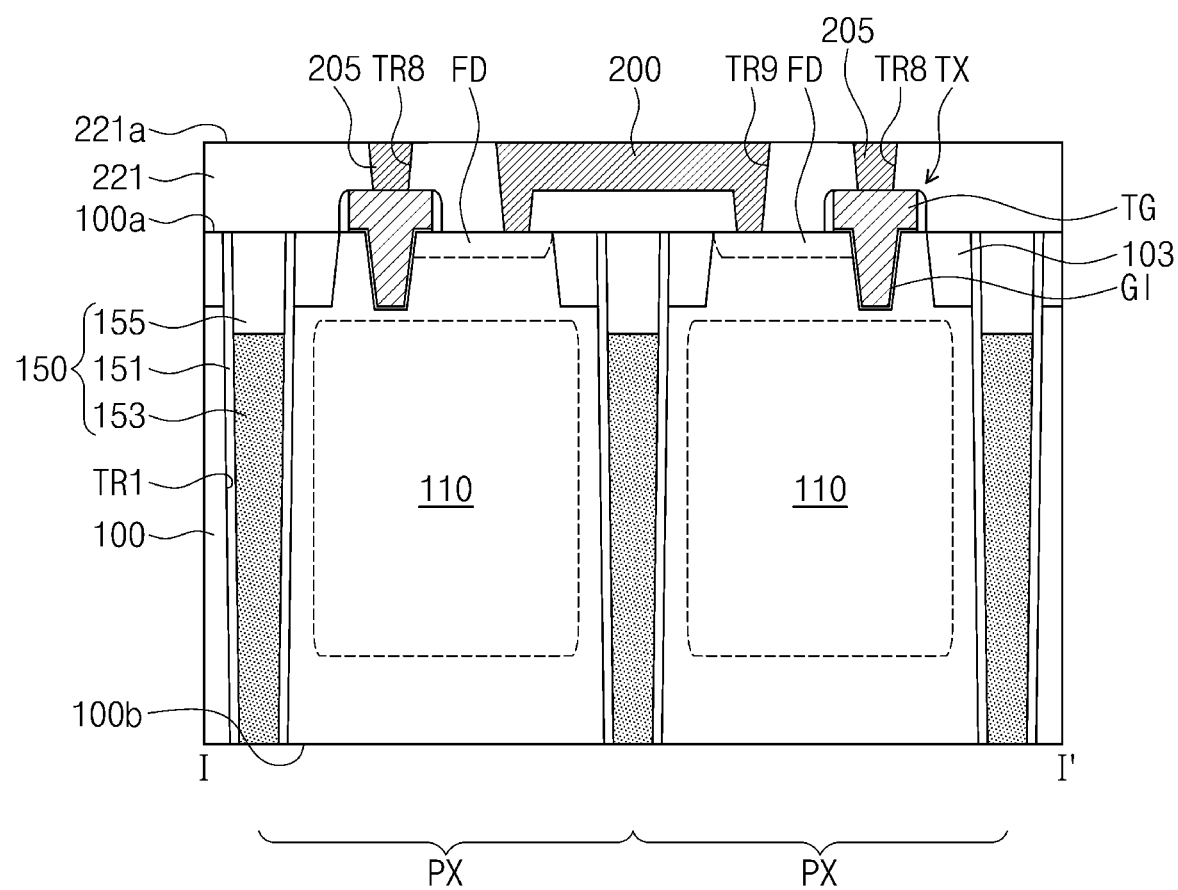

Referring to the exemplary embodiment of FIG. 22, the conductive structure 200 and the auxiliary conductive patterns 205 may be formed. The conductive structure 200 may be formed on the first surface 100a of the first substrate 100 and fills the ninth trench TR9. The auxiliary conductive patterns 205 may be respectively formed on the transfer gates TG to fill the eighth trenches TR8. A polishing process may be performed on the top surface 221a of the first insulating layer 221. As a result of the polishing process, top surfaces of the conductive structure 200 and the auxiliary conductive patterns 205 may be coplanar with each other.

Figure 23:
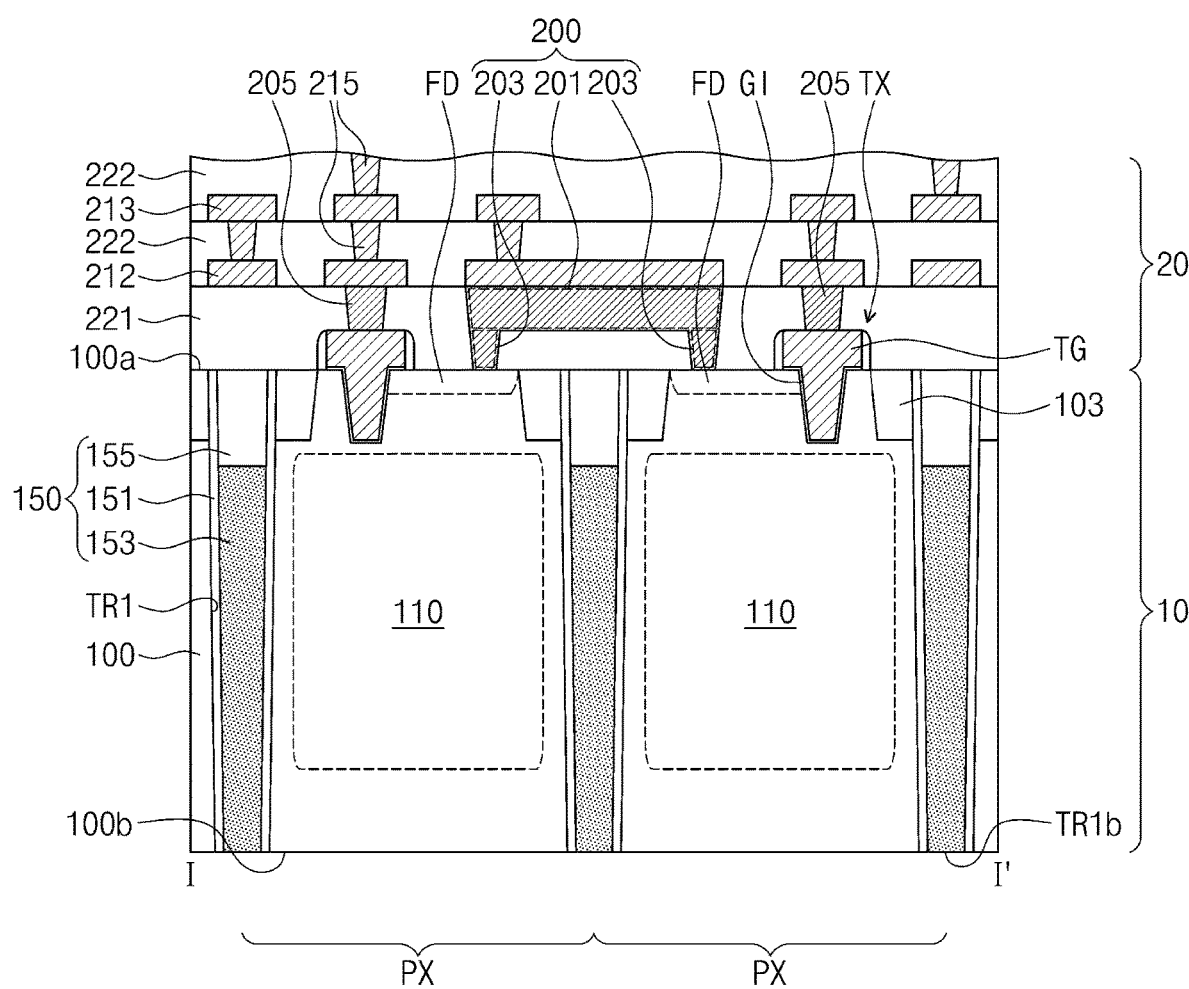

Referring to the exemplary embodiment of FIG. 23, the second insulating layers 222, the first and second interconnection lines 212 and 213, and the vias 215 may be formed on the first insulating layer 221.

Referring to the exemplary embodiment of FIG. 5, the anti-reflection layer 132, the first insulating layer 134, and the second insulating layers 136 may be sequentially formed on the second surface 100b of the first substrate 100. The color filters 303 may be formed on the unit pixel regions PX, respectively. The micro lenses 307 may be formed on the color filters 303, respectively. The image sensor of the exemplary embodiment of FIG. 5 may be fabricated by this fabrication process.

Referring back to FIG. 3, an image sensor according to an exemplary embodiment of the present inventive concepts may further include a circuit chip 2000. The circuit chip 2000 may be stacked on the sensor chip 1000. The circuit chip 2000 may include a second substrate 40 and a second interconnection layer 45. The second interconnection layer 45 may be interposed between the first interconnection layer 20 and the second substrate 40.

The pixel array region AR may include a plurality of the unit pixel regions PX. The pixel array region AR may be configured to have substantially the same features as that described with reference to the exemplary embodiments of FIGS. 2 to 5.

A first connection structure 50, a first pad terminal 81, and a bulk color filter 90 may be disposed on the first substrate 100 and in the optical black region OB. The first connection structure 50 may include a first light-blocking pattern 51, a first insulating pattern 53, and a first capping pattern 55. The first light-blocking pattern 51 may be disposed on the second surface 100b of the first substrate 100. The first light-blocking pattern 51 may be arranged to cover the second insulating layer 136 on the second surface 100b and to conformally cover inner surfaces of a third trench TR3 and a fourth trench TR4. The first light-blocking pattern 51 may penetrate the photoelectric conversion layer 10, the first interconnection layer 20, and the second interconnection layer 45 and may electrically connect the first interconnection layer 20 to the second interconnection layer 45. The first light-blocking pattern 51 may be in direct contact with interconnection lines in the first interconnection layer 20 and may be also in contact with the pixel isolation pattern 150 in the photoelectric conversion layer 10. Therefore, the first connection structure 50 may be electrically connected to the interconnection lines in the first interconnection layer 20. The first light-blocking pattern 51 may be formed of or include a metallic material (e.g., tungsten, etc.). The first light-blocking pattern 51 may prevent light from being incident into the optical black region OB.

The first pad terminal 81 may be disposed in the third trench TR3 to fill a remaining space of the third trench TR3. The first pad terminal 81 may be formed of or include a metallic material (e.g., aluminum). The first pad terminal 81 may be connected to the pixel isolation pattern 150 (e.g., the second isolation pattern 153). Thus, a negative voltage may be applied to the pixel isolation pattern 150 through the first pad terminal 81.

The first insulating pattern 53 may be disposed on the first light-blocking pattern 51 to fill a remaining space of the fourth trench TR4. The first insulating pattern 53 may be penetrate the photoelectric conversion layer 10 and the first interconnection layer 20. The first capping pattern 55 may be disposed on the first insulating pattern 53. For example, a lower surface of the first capping pattern 55 may be disposed directly on an upper surface of the first insulating pattern 53. The first capping pattern 55 may be formed of or include the same material as the capping pattern 155 of FIG. 4.

The bulk color filter 90 may be disposed on the first pad terminal 81, the first light-blocking pattern 51, and the first capping pattern 55. For example, a lower surface of the bulk color filter 90 may directly contact upper surfaces of the first light-blocking pattern 51 and the first capping pattern 55. The bulk color filter 90 may be arranged to cover the first pad terminal 81, the first light-blocking pattern 51, and the first capping pattern 55. A first protection layer 71 may be disposed on the bulk color filter 90 to cover the bulk color filter 90. For example, the first protection layer 71 may directly contact an upper surface and lateral side surfaces of the bulk color filter 90.

A photoelectric conversion region 110' and the dummy region 111 may be provided in the optical black region OB of the first substrate 100. The photoelectric conversion region 110' may be doped to have a conductivity type (e.g., the second conductivity type) that is different from the first conductivity type. The second conductivity type may be, for example, an n-type. In an exemplary embodiment, the photoelectric conversion region 110' may have a structure similar to the photoelectric conversion region 110 described with reference to the exemplary embodiment of FIG. 5 but may not be used to convert light to an electrical signal. For example, the dummy region ill may be an undoped region. In an exemplary embodiment, signals produced from the photoelectric conversion region 110' and the dummy region 111 may be used as information for removing a process noise.

In the pad region PAD, a second connection structure 60, a second pad terminal 83, and a second protection layer 73 may be disposed on the first substrate 100. The second connection structure 60 may include a second light-blocking pattern 61, a second insulating pattern 63, and a second capping pattern 65.

The second light-blocking pattern 61 may be disposed on the second surface 100b of the first substrate 100. The second light-blocking pattern 61 may be arranged to cover the second insulating layer 136 on the second surface 100b and to conformally cover inner surface of a fifth trench TR5 and a sixth trench TR6. The second light-blocking pattern 61 may penetrate the photoelectric conversion layer 10, the first interconnection layer 20, and a portion of the second interconnection layer 45. The second light-blocking pattern 61 may be in direct contact with the first and second interconnection lines 231 and 232 in the second interconnection layer 45. The second light-blocking pattern 61 may be formed of or include a metal material (e.g., tungsten, etc.).

The second pad terminal 83 may be disposed in the fifth trench TR5. The second pad terminal 83 may be arranged on the second light-blocking pattern 61 to fill a remaining space of the fifth trench TR5. In an exemplary embodiment, the second pad terminal 83 may be formed of or include a metal material (e.g., aluminum, etc.). The second pad terminal 83 may be used as an electric conduction path between the image sensor device and the outside. The second insulating pattern 63 may be arranged to fill the remaining space of the sixth trench TR6. The second insulating pattern 63 may wholly or partially penetrate the photoelectric conversion layer 10 and the first interconnection layer 20. The second capping pattern 65 may be disposed on the second insulating pattern 63. For example, a lower surface of the second capping pattern 65 may directly contact an upper surface of the second insulating pattern 63. In an exemplary embodiment, the second capping pattern 65 may be formed of or include the same material as the capping pattern 155 of FIG. 4. The second protection layer 73 may cover a portion of the second light-blocking pattern 61 and the second capping pattern 65.

An electrical current, which is applied through the second pad terminal 83, may be delivered to the pixel isolation pattern 150 through the second light-blocking pattern 61, the first and second interconnection lines 231 and 232 in the second interconnection layer 45, and the first light-blocking pattern 51. Electrical signals produced from the photoelectric conversion regions 110 and 110' and the dummy region 111 may be delivered to the outside through the interconnection lines of the first interconnection layer 20, the first and second interconnection lines 231 and 232 in the second interconnection layer 45, the second light-blocking pattern 61, and the second pad terminal 83.

According to an exemplary embodiment of the present inventive concepts, an image sensor may include a conductive structure having contacts that are coupled to floating diffusion regions and a connection portion connecting the contacts. The conductive structure may provide an increased voltage output from photoelectric conversion regions. In this exemplary embodiment, resolution of the image sensor may be increased.

While exemplary embodiments of the present inventive concepts have been particularly shown and described, it will be understood by one of ordinary skill in the art that variations in form and detail may be made therein without departing from the spirit and scope of the attached claims.

What is claimed is:

1. An image sensor, comprising:
a substrate having a first surface and a second surface that are opposite to each other, the substrate including a plurality of unit pixel regions having photoelectric conversion regions and floating diffusion regions disposed adjacent to the first surface,
gate electrodes disposed on the first surface of the substrate,
a pixel isolation pattern disposed in the substrate and configured to define the plurality of unit pixel regions; and
an interconnection layer disposed on the first surface of the substrate, the interconnection layer includes a conductive structure,
wherein the conductive structure comprises:
a connection portion that extends parallel to the first surface of the substrate and is spaced apart from the first surface of the substrate, a bottom surface of the connection portion is co-planar with top surfaces of the gate electrodes; and
contacts that extend vertically from the connection portion towards the first surface of the substrate, and
wherein each of the contacts are spaced apart from each other with the pixel isolation pattern interposed therebetween, wherein each of the contacts are coupled to the floating diffusion regions, respectively.

2. The image sensor of claim 1, wherein:
the interconnection layer further comprises interconnection lines and vias disposed on a top surface of the conductive structure; and
the interconnection lines and the vias are configured to be electrically connected to the conductive structure and the interconnection lines and the vias include a material that is different from the conductive structure.

3. The image sensor of claim 1, wherein:
the substrate comprises a plurality of pixel groups, each of the plurality of pixel groups includes a plurality of the unit pixel regions;
the floating diffusion regions are disposed in at least one of the plurality of pixel groups,
the contacts are disposed on the floating diffusion regions, respectively, and
the connection portion extends to connect to the contacts.

4. The image sensor of claim 1,
wherein the interconnection layer further comprises:
interconnection lines that contact the conductive structure;
a first insulating layer disposed between the interconnection lines and the first surface of the substrate, the first insulating layer is arranged to cover the gate electrodes and the first surface of the substrate; and
the conductive structure penetrates the first insulating layer and is configured to electrically connect the floating diffusion regions to the interconnection lines.

5. The image sensor of claim 1,
wherein the connection portion contacts top surfaces of a partial portion of the gate electrodes.

6. The image sensor of claim 1, wherein:
the conductive structure has a first height extending vertically from the first surface of the substrate to a top surface of the conductive structure; and
the first height of the conductive structure is in a range of about 50 nm to about 400 nm.

7. The image sensor of claim 1, wherein:
the interconnection layer further includes an auxiliary conductive pattern; and
a top surface of the auxiliary conductive pattern is disposed at a same level as a top surface of the connection portion.

8. The image sensor of claim 7, further comprising:
the gate electrodes include a first gate electrode and a second gate electrode that are spaced apart from each other with the pixel isolation pattern interposed therebetween; and
the auxiliary conductive pattern crosses the pixel isolation pattern and is configured to connect the first gate electrode to the second gate electrode.

9. An image sensor, comprising:
a substrate having a first surface and a second surface that are opposite to each other, the substrate including a plurality of pixel groups, each of the plurality of pixel groups including first to fourth unit pixel regions, the first to fourth unit pixel regions having first to fourth floating diffusion regions, respectively;
a pixel isolation pattern penetrating the substrate and configured to define the first to fourth unit pixel regions;
gate electrodes disposed on the first surface of the substrate;
color filters and micro lenses disposed on the second surface of the substrate; and
an interconnection layer disposed on the first surface of the substrate, the interconnection layer includes a conductive structure,
wherein the conductive structure comprises:
a connection portion that extends parallel to the first surface of the substrate and is spaced apart from the first surface of the substrate, a bottom surface of the connection portion is co-planar with top surfaces of the gate electrodes;
first to fourth contacts that extend vertically from the connection portion and are coupled to the first to fourth floating diffusion regions, respectively; and
the connection portion is configured to electrically connect the first to fourth contacts to each other.

10. The image sensor of claim 9, wherein:
the interconnection layer further comprises interconnection lines that contact the conductive structure,
wherein the conductive structure includes tungsten, and
the interconnection lines includes copper.

11. The image sensor of claim 10, wherein:
the interconnection layer further includes a first insulating layer that is arranged to cover the first surface of the substrate;
the interconnection lines are disposed on the first insulating layer; and the conductive structure penetrates the first insulating layer and is disposed between the interconnection lines and the first surface of the substrate.

12. The image sensor of claim 9, wherein the pixel isolation pattern includes poly silicon.

13. The image sensor of claim 9, wherein:
the interconnection layer further includes an auxiliary conductive pattern; and
the auxiliary conductive pattern extends parallel to a portion of the connection portion and is spaced apart from the portion of the connection portion.

14. The image sensor of claim 13, further comprising:
the gate electrodes include first to fourth gate electrodes disposed on the first surface of the substrate and are disposed in the first to fourth unit pixel regions, respectively,
the first and second gate electrodes are arranged to be symmetric to each other with the pixel isolation pattern interposed therebetween; and
the auxiliary conductive pattern extends from a top surface of the first gate electrode to a top surface of the second gate electrode in a direction parallel to the first surface of the substrate.

15. The image sensor of claim 9, wherein:
the interconnection layer further comprises a pair of auxiliary conductive patterns that are spaced apart from each other;
the pair of auxiliary conductive patterns have top surfaces that are disposed at a same level as a top surface of the conductive structure; and
the conductive structure is disposed between the pair of auxiliary conductive patterns.

16. An image sensor, comprising:
a substrate having a first surface and a second surface that are opposite to each other, the substrate including a pixel array region, an optical black region, and a pad region, the pixel array region including a plurality of unit pixel regions having photoelectric conversion regions,
a pixel isolation pattern and a device isolation pattern disposed in the substrate, the pixel isolation pattern penetrates the device isolation pattern and is configured to define the plurality of unit pixel regions;
an interconnection layer disposed on the first surface of the substrate;
transfer transistors and logic transistors disposed on the first surface of the substrate and including gate electrodes;
color filters and micro lenses disposed on the second surface of the substrate;
a first light-blocking pattern and a first pad terminal disposed in the optical black region of the substrate, the first light-blocking pattern penetrates the substrate, the first pad terminal is disposed on the second surface of the substrate and is configured to be electrically connected to the first light-blocking pattern; and
a second pad terminal disposed in the pad region of the substrate and disposed on the second surface of the substrate,
wherein the interconnection layer comprises:
a first insulating layer arranged to cover the first surface of the substrate;
a conductive structure penetrating the first insulating layer, the conductive structure including a connection portion that extends parallel to the first surface of the substrate, and contacts that extend vertically from the connection portion towards the first surface of the substrate, wherein a bottom surface of the connection portion is co-planar with top surfaces of the gate electrodes; and
interconnection lines and vias disposed on and coupled to the conductive structure.

17. The image sensor of claim 16, wherein:
the pixel isolation pattern includes a first isolation pattern arranged to cover an inner surface of a first trench of the substrate, and a second isolation pattern that fills the first trench;
the second isolation pattern includes poly silicon doped with impurities; and
the second isolation pattern is configured to receive a negative bias voltage through the first pad terminal.

* * * * *